(12) United States Patent
Carley et al.

(10) Patent No.: US 7,724,097 B2
(45) Date of Patent: May 25, 2010

(54) DIRECT DIGITAL SYNTHESIZER FOR REFERENCE FREQUENCY GENERATION

(75) Inventors: L. Richard Carley, Sewickley, PA (US); Anthony L. Tsangaropoulos, San Carlos, CA (US); Esa Tarvainen, Graz (AU)

(73) Assignee: Resonance Semiconductor Corporation, Pittsburgh, PA (US)

( * ) Notice: Subject to any disclaimer, the term of this patent is extended or adjusted under 35 U.S.C. 154(b) by 75 days.

(21) Appl. No.: 12/229,948

(22) Filed: Aug. 28, 2008

(65) Prior Publication Data

US 2010/0052797 A1    Mar. 4, 2010

(51) Int. Cl.
- H03B 1/00 (2006.01)
- H03K 21/00 (2006.01)
- H03K 21/08 (2006.01)
- H03K 21/38 (2006.01)

(52) U.S. Cl. .................................. 331/74; 377/48
(58) Field of Classification Search .................... 331/16, 331/74; 327/115, 117, 118; 377/47, 48
See application file for complete search history.

(56) References Cited

U.S. PATENT DOCUMENTS

| | | | |
|---|---|---|---|
| 3,555,446 A | 1/1971 | Braymer | |
| 4,410,954 A | 10/1983 | Wheatley, III | |
| 4,516,861 A | 5/1985 | Frew et al. | |
| 4,652,832 A | 3/1987 | Jasper | |
| 4,657,406 A | 4/1987 | Yaeda et al. | |
| 4,815,018 A | 3/1989 | Reinhardt et al. | |
| 4,933,890 A | 6/1990 | Nuytkens et al. | |
| 4,975,931 A * | 12/1990 | Cosand | 377/52 |
| 5,014,231 A | 5/1991 | Reinhardt et al. | |
| 5,216,389 A | 6/1993 | Carralero et al. | |
| 6,064,272 A | 5/2000 | Rhee | |
| 6,188,261 B1 | 2/2001 | Nosaka et al. | |
| 6,642,754 B1 | 11/2003 | Dobramysl et al. | |

(Continued)

OTHER PUBLICATIONS

Nakagawa et al.,"A Direct Digital Synthesizer with Interpolation Circuits," IEEE, Journal of Solid-State Circuits, vol. 32 No. 5, pp. 766-770 © 1997.

(Continued)

*Primary Examiner*—David Mis
(74) *Attorney, Agent, or Firm*—Lerner, David, Littenberg, Krumholz & Mentlik, LLP

(57) ABSTRACT

A direct digital frequency synthesizer having a multi-modulus divider, a numerically controlled oscillator and a programmable delay generator. The multi-modulus divider receives an input clock having an input pulse frequency $f_{osc}$ and outputs some integer fraction of those pulses at an instantaneous frequency $f_{V_p}$ that is some integer fraction (1/P) of the input frequency. The multi-modulus divider selects between at least two ratios of P (1/P or 1/P+1) in response to a signal from the numerically controlled oscillator. The numerically controlled oscillator receives a value which is the accumulator increment (i.e. the number of divided pulse edges) required before an overflow occurs that causes the multi-modulus divider to change divider ratios in response to receiving an overflow signal. The numerically controlled oscillator also outputs both the overflow signal and a delay signal to the delay generator that further controls the frequency of the multi-modulus divider output signal ($V_p$) to provide an output signal ($V_D$) with an $f_{out}$ that has improved phase and timing jitter performance over prior art direct digital frequency synthesizer architectures.

23 Claims, 18 Drawing Sheets

U.S. PATENT DOCUMENTS

| | | |
|---|---|---|
| 7,205,811 B2 | 4/2007 | Freyman et al. |
| 2005/0253632 A1 | 11/2005 | Fahim |
| 2008/0048794 A1 | 2/2008 | Mccorquodale et al. |

OTHER PUBLICATIONS

Hauser, "A Simple Technique for Analog Tuning of Frequency Synthesizers," IEEE, Transactions on Instrumentation and Measurement, vol. 28 No. 6; pp. 1141-1146, © 1989.

Nosaka et al., "A Low-Power Direct Digital Synthesizer Using a Self-Adjusting Phase-Interpolation Technique," IEEE, Journal of Solid-State Circuits, vol. 36 No. 8, pp. 1281-1285, © 2001.

Nosaka et al., "A Phase Interpolation Direct Digital Synthesizer with a Digitally Controlled Delay Generator," Symposium on VLSI Circuits, pp. 75-76, 1997.

Nosaka et al., "Phase interpolation direct digital synthesiser with precise delay generator using two-step integration," Electronics Letters, vol. 37 No. 18, pp. 1112-1113, (Aug. 30, 2001).

Reinhardt et al., "A Short Survey of Frequency Synthesizer Techniques", 40th Annual Frequency Control Symposium, © 1986, IEEE, pp. 355-365.

Nieznadski, "An Alternative Approach to the ROM-less Direct Digital Synthesis" IEEE, Journal of Solid-State Circuits, vol. 33 No. 1, pp. 770-771, © 1998.

Nakagawa et al., "A Direct Digital Synthesizer with Interpolation Circuits," pp. 58-59, 1996, IEEE, 1996 Symposium on VLSI Circuits.

Calbaza et al., "Jitter Model of Direct Digital Synthesis Clock Generators", Department of Electrical & Computer Engineering, Ecole Polytechnique de Montreal, pp. 11-14, (1999).

\* cited by examiner

FIG. 5A

| | P = 4 |
|---|---|
| $N_A$ = 3 | |
| $N_D$ = 3 | $F_{osc}$ (MHz) = 2000 |
| K = 3 | $T_{osc}$ = 0.5 |

| Instance # | Acc Value | overflow? | P value | Tosc count | tp (nsec) | Tp (nsec) | $D_{(n-1)}$ (fraction) | tb (nsec) | $T_b$ (nsec) | fout (MHz) |
|---|---|---|---|---|---|---|---|---|---|---|
| A0 | 0 | OVF | P+1 | 0 | 0 | 2.5 | - | - | - | - |
| A1 | 3 | - | P | 5 | 2.5 | 2.0 | 0.000 | 2.500 | 2.1875 | 457.143 |
| A2 | 6 | - | P | 9 | 4.5 | 2.0 | 0.375 | 4.688 | 2.1875 | 457.143 |
| A3 | 1 | OVF | P+1 | 13 | 6.5 | 2.5 | 0.750 | 6.875 | 2.1875 | 457.143 |
| A4 | 4 | - | P | 18 | 9.0 | 2.0 | 0.125 | 9.063 | 2.1875 | 457.143 |
| A5 | 7 | - | P | 22 | 11.0 | 2.0 | 0.500 | 11.250 | 2.1875 | 457.143 |
| A6 | 2 | OVF | P+1 | 26 | 13.0 | 2.5 | 0.875 | 13.438 | 2.1875 | 457.143 |
| A7 | 5 | - | P | 31 | 15.5 | 2.0 | 0.250 | 15.625 | 2.1875 | 457.143 |
| A8 | 0 | OVF | P+1 | 35 | 17.5 | 2.5 | 0.625 | 17.813 | 2.1875 | 457.143 |
| A9 | 3 | - | P | 40 | 20.0 | 2.0 | 0.000 | 20.000 | 2.1875 | 457.143 |
| A10 | 6 | - | P | 44 | 22.0 | 2.0 | 0.375 | 22.188 | 2.1875 | 457.143 |
| A11 | 1 | OVF | P+1 | 48 | 24.0 | 2.5 | 0.750 | 24.375 | 2.1875 | 457.143 |
| A12 | 4 | - | P | 53 | 26.5 | 2.0 | 0.125 | 26.563 | 2.1875 | 457.143 |
| A13 | 7 | - | P | 57 | 28.5 | 2.0 | 0.500 | 28.750 | 2.1875 | 457.143 |
| A14 | 2 | OVF | P+1 | 61 | 30.5 | 2.5 | 0.875 | 30.938 | 2.1875 | 457.143 |
| A15 | 5 | - | P | 66 | 33.0 | 2.0 | 0.250 | 33.125 | 2.1875 | 457.143 |

FIG. 5B

| | |
|---|---|
| $N_A = 4$ | $P = 4$ |
| $N_D = 3$ | $F_{OSC}$ (MHz) = 2000 |
| $K = 7$ | $T_{osc} = 0.5$ |

| Instance # | Acc Value | overflow? | P value | Tosc count | tp (nsec) | Tp (nsec) | D[n-1] (fraction) | tD (nsec) | TD (nsec) | fOUT (MHz) |
|---|---|---|---|---|---|---|---|---|---|---|
| A0  | 0  | OVF | P+1 | 0  | 0    | 2.5  | -     | -      | -     | -       |
| A1  | 7  | -   | P   | 5  | 2.5  | 2.0  | 0.000 | 2.500  | 2.188 | 457.143 |
| A2  | 14 | -   | P   | 9  | 4.5  | 2.0  | 0.375 | 4.688  | 2.250 | 444.444 |
| A3  | 5  | OVF | P+1 | 13 | 6.5  | 2.5  | 0.875 | 6.938  | 2.188 | 457.143 |
| A4  | 12 | -   | P   | 18 | 9.0  | 2.0  | 0.250 | 9.125  | 2.250 | 444.444 |
| A5  | 3  | OVF | P+1 | 22 | 11.0 | 2.5  | 0.750 | 11.375 | 2.188 | 457.143 |
| A6  | 10 | -   | P   | 27 | 13.5 | 2.0  | 0.125 | 13.563 | 2.250 | 444.444 |
| A7  | 1  | OVF | P+1 | 31 | 15.5 | 2.5  | 0.625 | 15.813 | 2.188 | 457.143 |
| A8  | 8  | -   | P   | 36 | 18.0 | 2.0  | 0.000 | 18.000 | 2.250 | 444.444 |
| A9  | 15 | -   | P   | 40 | 20.0 | 2.0  | 0.500 | 20.250 | 2.188 | 457.143 |
| A10 | 6  | OVF | P+1 | 44 | 22.0 | 2.5  | 0.875 | 22.438 | 2.250 | 444.444 |
| A11 | 13 | -   | P   | 49 | 24.5 | 2.0  | 0.375 | 24.688 | 2.188 | 457.143 |
| A12 | 4  | OVF | P+1 | 53 | 26.5 | 2.5  | 0.750 | 26.875 | 2.250 | 444.444 |
| A13 | 11 | -   | P   | 58 | 29.0 | 2.0  | 0.250 | 29.125 | 2.188 | 457.143 |
| A14 | 2  | OVF | P+1 | 62 | 31.0 | 2.5  | 0.625 | 31.313 | 2.250 | 444.444 |
| A15 | 9  | -   | P   | 67 | 33.5 | 2.0  | 0.125 | 33.563 | 2.188 | 457.143 |
| A16 | 0  | OVF | P+1 | 71 | 35.5 | -35.5| 0.500 | 35.750 | 2.188 | 457.143 |

FIG. 12A

| Nₐ = NK = 4 | | P = 4 | |
|---|---|---|---|
| Nb = 3 | | Fosc (MHz) = 2000 | |
| K = 11 | | Tosc = 0.5 | |

| Nbits= | 3 | 4 | | | | | | | | | | | | |
|---|---|---|---|---|---|---|---|---|---|---|---|---|---|---|
| Instance # | Acc.In | Acc Out | OVF | D3 | D2 | D1 | D0 | Div Setting | Tosc count | tp (nsec) | Tp (nsec) | D(n,1) (fraction) | tb (nsec) | T₀ (nsec) | four (MHz) |
| A0 | 0 | 11 | 0 | 1 | 0 | 1 | 1 | | 0 | 0 | 2.5 | | | - | - |
| A1 | 3 | 14 | 1 | 1 | 1 | 1 | 0 | P+1 | 5 | 2.5 | 2.5 | 3/8 | 2.688 | 2.6875 | 372.093 |
| A2 | 6 | 1 | 1 | 0 | 0 | 0 | 1 | P+2 | 10 | 5.0 | 3.0 | 3/4 | 5.375 | 2.6875 | 372.093 |
| A3 | 1 | 12 | 0 | 1 | 1 | 0 | 0 | P+1 | 16 | 8.0 | 2.5 | 1/8 | 8.063 | 2.6875 | 372.093 |
| A4 | 4 | 15 | 1 | 1 | 1 | 1 | 1 | P+1 | 21 | 10.5 | 2.5 | 1/2 | 10.750 | 2.6875 | 372.093 |
| A5 | 7 | 2 | 1 | 0 | 0 | 1 | 0 | P+2 | 26 | 13.0 | 3.0 | 7/8 | 13.438 | 2.6875 | 372.093 |
| A6 | 2 | 13 | 0 | 1 | 1 | 0 | 1 | P+1 | 32 | 16.0 | 2.5 | 1/4 | 16.125 | 2.6875 | 372.093 |
| A7 | 5 | 0 | 1 | 0 | 0 | 0 | 0 | P+2 | 37 | 18.5 | 3.0 | 5/8 | 18.813 | 2.6875 | 372.093 |
| A8 | 0 | 11 | 0 | 1 | 0 | 1 | 1 | P+1 | 43 | 21.5 | 2.5 | 0 | 21.500 | 2.6875 | 372.093 |
| A9 | 3 | 14 | 1 | 1 | 1 | 1 | 0 | P+1 | 48 | 24.0 | 2.5 | 3/8 | 24.188 | 2.6875 | 372.093 |
| A10 | 6 | 1 | 1 | 0 | 0 | 0 | 1 | P+2 | 53 | 26.5 | 3.0 | 3/4 | 26.875 | 2.6875 | 372.093 |
| A11 | 1 | 12 | 0 | 1 | 1 | 0 | 0 | P+1 | 59 | 29.5 | 2.5 | 1/8 | 29.563 | 2.6875 | 372.093 |
| A12 | 4 | 15 | 1 | 1 | 1 | 1 | 1 | P+1 | 64 | 32.0 | 2.5 | 1/2 | 32.250 | 2.6875 | 372.093 |
| A13 | 7 | 2 | 1 | 0 | 0 | 1 | 0 | P+2 | 69 | 34.5 | 3.0 | 7/8 | 34.938 | 2.6875 | 372.093 |
| A14 | 2 | 13 | 0 | 1 | 1 | 0 | 1 | P+1 | 75 | 37.5 | 2.5 | 1/4 | 37.625 | 2.6875 | 372.093 |
| A15 | 5 | 0 | 1 | 0 | 0 | 0 | 0 | P+2 | 80 | 40.0 | 3.0 | 5/8 | 40.313 | 2.6875 | 372.093 |
| A16 | 0 | 11 | 0 | 1 | 0 | 1 | 1 | P+1 | 86 | 43.0 | 2.5 | 0 | 43.000 | 2.6875 | 372.093 |

FIG. 12B

| OVF (MC1) | MSB (MC0) | div by: |
|---|---|---|
| 0 | 0 | P |
| 0 | 1 | P+1 |
| 1 | 0 | P+2 |
| 1 | 1 | P+1 |

FIG. 12C

| vi | P cycle count | P+1 cycle count | P+2 cycle count | |
|----|---------------|-----------------|-----------------|---|
| 0  | 8 | 0 | 0 | Tout = 2 Tosc/2^NA × 8P |
| 1  | 7 | 1 | 0 | Tout = 2 Tosc/2^NA × [7P+(P+1)] |
| 2  | 6 | 2 | 0 | Tout = 2 Tosc/2^NA × [6P+2(P+1)] |
| 3  | 5 | 3 | 0 | Tout = 2 Tosc/2^NA × [5P+3(P+1)] |
| 4  | 4 | 4 | 0 | Tout = 2 Tosc/2^NA × [4P+4(P+1)] |
| 5  | 3 | 5 | 0 | Tout = 2 Tosc/2^NA × [3P+5(P+1)] |
| 6  | 2 | 6 | 0 | Tout = 2 Tosc/2^NA × [2P+6(P+1)] |
| 7  | 1 | 7 | 0 | Tout = 2 Tosc/2^NA × [1P+7(P+1)] |
| 8  | 0 | 8 | 0 | Tout = 2 Tosc/2^NA × 8(P+1) |
| 9  | 0 | 7 | 1 | Tout = 2 Tosc/2^NA × [7(P+1)+1(P+2)] |
| 10 | 0 | 6 | 2 | Tout = 2 Tosc/2^NA × [6(P+1)+2(P+2)] |
| 11 | 0 | 5 | 3 | Tout = 2 Tosc/2^NA × [5(P+1)+3(P+2)] |
| 12 | 0 | 4 | 4 | Tout = 2 Tosc/2^NA × [4(P+1)+4(P+2)] |
| 13 | 0 | 3 | 5 | Tout = 2 Tosc/2^NA × [3(P+1)+5(P+2)] |
| 14 | 0 | 2 | 6 | Tout = 2 Tosc/2^NA × [2(P+1)+6(P+2)] |
| 15 | 0 | 1 | 7 | Tout = 2 Tosc/2^NA × [(P+1)+7(P+2)] |

DIRECT DIGITAL SYNTHESIZER FOR REFERENCE FREQUENCY GENERATION

BACKGROUND OF THE INVENTION

1. Field of the Invention

The present invention provides frequency synthesizer circuit architectures that are particularly adapted for use in computation, control and communication applications.

2. Description of Related Art

Low frequency (32 KHz-300 MHz) clock or timing signals are employed in electronic devices for many different applications. A typical reference oscillator may use a quartz resonator or another resonator which may operate on a fundamental frequency (less than about 40 MHz) or an overtone mode of oscillation (about 30 to 300 MHz). However, certain electronic devices (e.g., mobile communication devices) require higher frequency (500 MHz-3 GHz) timing signals which either cannot be generated directly by quartz resonators or other electro-acoustic resonators, or are prohibitively expensive to generate using such resonators. Also, high-frequency oscillators that use non-acoustic resonator technology (e.g., an inductor/capacitor resonant tank) cannot achieve the low phase noise or low power consumption required by many applications. Furthermore, conventional oscillator solutions may be too costly or too bulky for certain product applications and/or fail to provide a sufficient variety of output frequencies with sufficiently low noise.

An alternate approach to generating a reference signal is frequency synthesis, which can be performed either indirectly, by employing a phase lock loop ("PLL"), or directly, by employing a direct digital synthesizer ("DDS").

In PLL frequency synthesis, a reference oscillator operating at a relatively low frequency ($f_{REF}$) is employed to generate a higher output frequency ($f_{out} > f_{REF}$) with a desired accuracy. To accomplish this synthesis, the frequency of a voltage controlled oscillator ("VCO") is adjusted until the phase error between the reference oscillator and the VCO is minimized. The VCO is adjusted by a feedback loop that compares the frequency and phase of the VCO to that of the reference oscillator. When the loop settles, the VCO frequency closely tracks both the frequency and phase of the reference signal according to a predetermined harmonic relationship defined by the division ratios of the dividers used in the PLL circuit, e.g. $f_{VCO}/N = f_{REF}/M$. Non-harmonic scaling may be obtained by rapidly switching the divider between adjacent ratios P and P+1 with the aid of a controller often employing a delta-sigma modulator loop. The instantaneous output frequency alternates between $f_{REF}*P/M$ and $f_{REF}*(P+1)/M$, and the average frequency equals $f_{REF}*(P+N)/M$ where N is a non-integer value between 0 and 1. Simultaneously with the divider modulus control, a phase correction is also applied to the divider output signal before it is compared with the reference signal to produce an error signal that is low-pass-filtered and applied to the VCO input. This implementation is also known as a fractional-N synthesizer.

The output signal of a fractional-N PLL may be degraded by the presence of spurious signals and noise that result from the constant switching of the P divider. These undesired signals must be minimized to meet the requirements of practical applications, which results in increased power consumption and loop settling time.

In typical DDS architectures, a higher reference frequency generator is used with a numerically controlled oscillator ("NCO") to produce an output signal having controlled frequency and phase. The DDS output frequency range and resolution is mainly determined by the reference frequency and the length of the NCO word. As a result, DDS circuits that deliver a higher synthesized output frequency tend to have higher power consumption.

While existing phase interpolating DDS architectures may provide generation of a wide range of output frequencies from a single reference oscillator, improved DDS architectures are desired.

SUMMARY OF THE INVENTION

In accordance with aspects of the present invention, DDS synthesizer architecture derive a signal with selectable output frequency ("$f_{OUT}$") from an oscillator signal with higher fixed frequency ("$f_{osc}$") using a combination of a multi-modulus divider providing at least two possible modulii for reducing the frequency of an input signal to achieve the desired frequency for $f_{out}$ and a variable delay to achieve a desired instantaneous phase for $f_{OUT}$. The resultant $f_{out}$ signal may then be used to clock or drive circuitry in a user device that requires a lower reference frequency.

In one embodiment the frequency synthesizer has an input for receiving a clock reference signal at a first frequency $f_{osc}$. The direct digital synthesizer (DDS) architecture has a multi-modulus divider for dividing the frequency of the input signal to provide an intermediate signal. Multi-modulus, as used herein, refers to the multiple programmable division ratios used to divide the frequency of the input signal into a lower frequency. The embodiment also has a numerically controlled oscillator (NCO) having an accumulator receiving an accumulator increment value. The NCO provides a phase value to a latch circuit. The latch circuit receives and is clocked by the intermediate signal wherein the numerically controlled oscillator outputs a delay value comprised of one or more bits and an overflow signal comprised of one or more bits wherein said overflow signal is provided to the multi-modulus divider to select between at least a first divider ratio and a second divider ratio. The DDS also has a programmable delay generator. In one embodiment, the delay generator receives the delay signal having one or more bits and the overflow signal containing one bit. In preferred embodiments the delay generator receives one or more reference clock signals (e.g. the clock input signal to the multi-modulus divider and or the signal with the intermediate adjusted frequency output from the multi-modulus divider. From the inputs, the delay generator calculates a delay time for application to each pulse in the signal with an intermediate adjusted frequency to provide an output signal which achieves improved phase noise and timing jitter performance ($f_{out}$).

In certain preferred embodiments discussed herein, the multi-modulus divider selects between first and second divider ratios, while in other preferred embodiments the multi-modulus divider selects between a first divider ratio, a second divider ratio and a third divider ratio. In some instances selected embodiments also have one or more programmable dividers. In these embodiments, the programmable divider operates on the signal input into the multi-modulus divider or on the intermediate signal output from the programmable divider. If the former, the programmable pre-multi-modulus divider reduces the overall power consumption by providing a lower frequency signal to the multi-modulus divider. If the latter, the programmable post-multimodulus divider provides a wide range of division ratios by which the frequency of the signal input to the multi-modulus divider is divided.

BRIEF DESCRIPTION OF THE DRAWINGS

The foregoing and other objects and advantages of the invention will be appreciated more fully from the following further description thereof, with reference to the accompanying drawings, wherein:

FIGS. 5a and 5b are tables illustrating the behavior of a 3 and 4-bit NCO DDS systems in accordance with aspects of the present invention.

FIGS. 12a-c illustrates the operation of one embodiment of FIG. 11.

DETAILED DESCRIPTION

The present invention is described in terms of several embodiments. In describing these embodiments, including the drawings, specific terminology will be used for the sake of clarity. Also, in the discussion of certain mathematical relationships, certain variable values are discussed by way of illustration. However, the invention is not intended to be limited to the specific embodiments described below.

Figure 1:
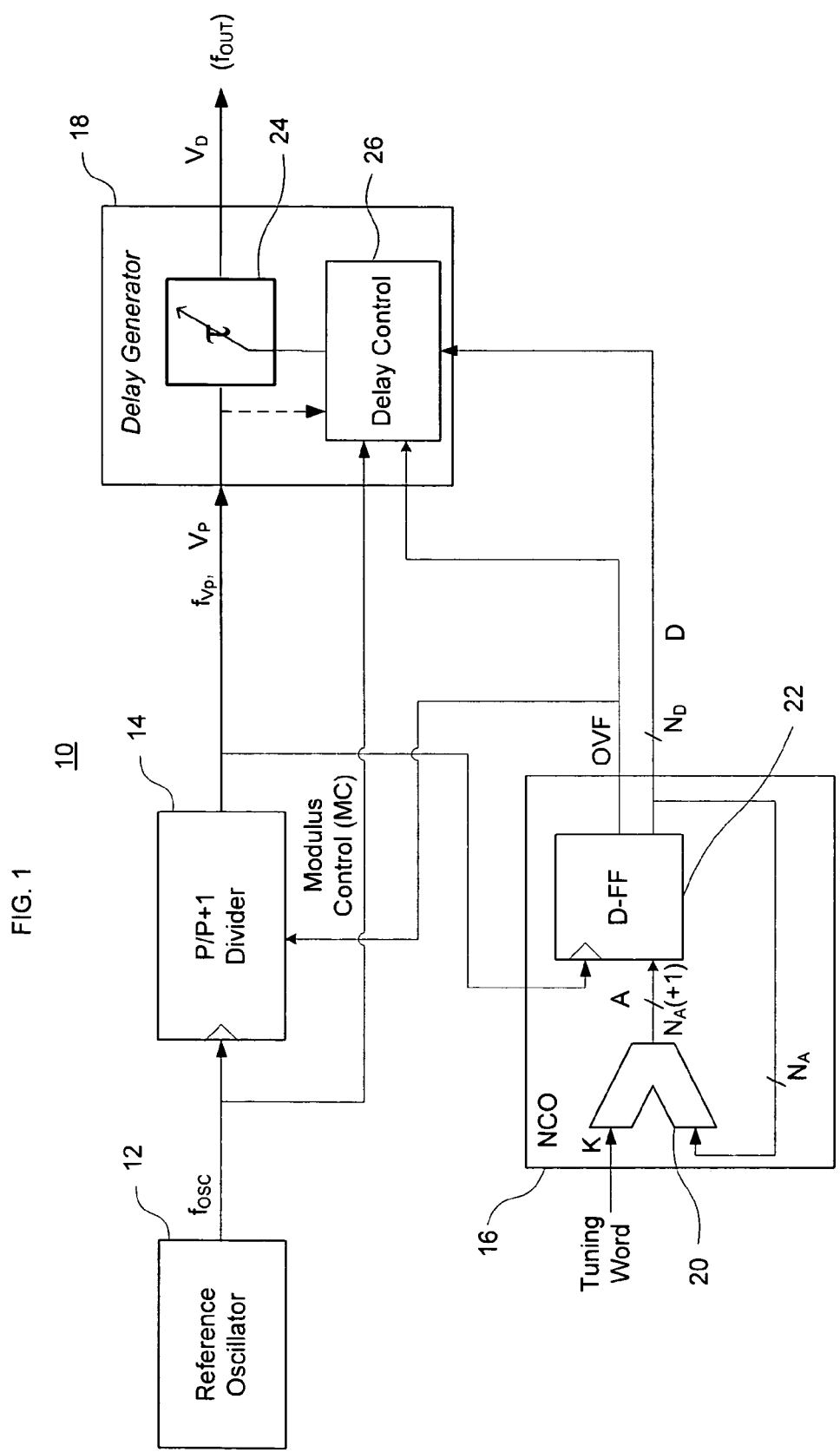
FIG. 1 illustrates a functional block diagram of a DDS architecture in accordance with aspects of the invention.

FIG. 1 is a schematic illustration of a multi-modulus divider direct digital synthesizer ("DDS") architecture 10 in accordance with aspects of the present invention. This exemplary DDS architecture 10 includes a reference oscillator 12, a multi-modulus divider 14, an NCO 16 and a delay generator 18, which is also referred to herein as a "phase interpolator."

Reference oscillator 12 produces a periodic waveform with a frequency $f_{osc}$. As shown in the figure, $f_{OSC}$ is provided to the multi-modulus divider 14 and the delay generator 18. The reference oscillator 12 may, by way of example, utilize a bulk acoustic wave resonator (e.g., FBAR-type or SMR-type), a micromechanical or nanomechanical resonator, a dielectric resonator, an LC tank or a quartz resonator.

The multi-modulus divider 14 is illustrated as a dual modulus divider which is operable to switch between division ratios P and P+1 to modify the received $f_{OSC}$ signal. As will be discussed in detail below, the division ratio is controlled by the overflow output of the NCO. This overflow output is also referred to as modulus control ("MC"). The multi-modulus divider 14 is preferably synchronous with the oscillator frequency $f_{OSC}$.

The NCO 16 includes an adder or accumulator 20 and a holding circuit/register 22. The holding circuit 22 may be, for example, a bank of delay flip-flops or latches. The NCO 16 may also include a look-up table and other phase control circuits (not shown).

The delay generator 18 generally has a programmable delay circuit 24 whose function is to delay individual pulse edges based on a control word. The delay generator 18 also includes a delay control circuit 26 that receives various timing signals along with the NCO output word and provides the control word to the delay circuit 24. The delay generator 18 is used to delay the phase of a resultant output signal relative to the phase the signal input to the delay generator 18.

As shown in FIG. 1, in response to the input signal $f_{OSC}$, the multi-modulus programmable divider 14 provides a clocking signal $V_P$ to the NCO 16 and the phase interpolator 18. The frequency $f_{DIV}$ of signal $V_P$ is related to $f_{OSC}$ as follows: $f_{Vp}=f_{OSC}/P_{set}$ where $P_{set}$ can be P or P+1 as determined by the modulus control signal MC output from the NCO 16.

The NCO 16, in particular holding circuit 22, is clocked by the output $V_P$ of the multi-modulus divider 14. As further shown in FIG. 1, a digital tuning word K is provided as an input to the accumulator 20 of the NCO 16. The holding circuit 22 of NCO 16 outputs an overflow value ("OVF") or MC as well as an output word $N_A$. The input word K sets the value by which the accumulator output value ("A") of word length $N_A$ is incremented for each $V_P$ pulse generated by the multi-modulus programmable divider 14. The value D is the portion of the accumulator output value A that is output from the NCO 16. D is used to set the delay of the delay generator/phase interpolator 18. The word length of D is $N_D$. As described in further detail $N_D \leq N_A$ ($N_A$ is the word length of value A).

In particular, the NCO 16, clocked at $f_{Vp}$, computes the phase value of the synthesized signal. Tuning word K, provided to accumulator 20 of the NCO 16, specifies how many $V_P$ periods are counted by the accumulator 20 for each $f_{OUT}$ period. The holding circuit 22 in the NCO 16 updates the phase value calculated by the accumulator 20 at intervals of $1/f_{Vp}$. The delay value (as represented by D and which, in certain embodiments, is a truncated word of that output from the holding circuit) and the overflow signal OVF are provided to the delay generator 18 to generate a residual phase correction via delay control 26.

The instantaneous frequency of signal $V_P$ oscillates between $f_{OSC}/P$ and $f_{OSC}/(P+1)$, where P is the multi-modulus programmable divider base value, depending on the value of the modulus control signal MC. It can be shown that for $N_A=N_D$, the average value of the output frequency $f_{OUT}$ is as follows:

$$f_{OUTideal}=f_{OSC}/(P+K/2^{N_A}) \quad (2)$$

where P is the multi-modulus programmable divider base value, K is the programmed NCO accumulator increment value as described above and $N_A$ is the NCO word length. The ratio $K/2^{N_A}$ can range from 0 to $1-(2^{-N_A})$. As a result, the instantaneous frequency deviation of signal $V_P$ at the $n^{th}$ pulse instant is:

$$\Delta f_{V_P}(n) = f_{OUTideal} - f_{V_P}(n) = f_{OSC}*[1/(P+K/2^{N_A}) - 1/P_n] = f_{OSC}/P_n*[P_n - (P+K/2^{N_A})]/(P+K/2^{N_A}). \quad (3)$$

It is easy to prove that the maximum error occurs for $K=2^{(N_A-1)}$. An example of this is illustrated in FIG. 5B discussed below. For large $N_A$ values, this is $-f_{OSC}/(2P^2+P)$ for $P_n=P$, or $f_{OSC}/(2P^2+3P+1)$ for $P_n=P+1$.

Holding circuit 22 in NCO 16 latches at least the $N_A$ bits of the accumulator output word A. It is advantageous if the holding circuit 22 also latches the overflow signal bit of the accumulator 20. The holding circuit 22 is latched by the signal $V_P$. A portion of the accumulator output word, which is referred to herein as delay value $D_{(n-1)}$, is provided to the delay control circuit 26 of the delay generator 18 along with the overflow value OVF, with a delay of one $V_P$ pulse period. The NCO phase value at each overflow instant represents the residual phase portion of the accumulator output word A and is used to provide a phase correction to the delay control circuit 26 while the overflow pulse OVF (MC) controls the modulus of multi-modulus divider 14. It should be noted that the edges of the $V_P$ pulse train are delayed by the programmable delay generator 18 based on the phase value originating from the NCO 16.

Figure 2:
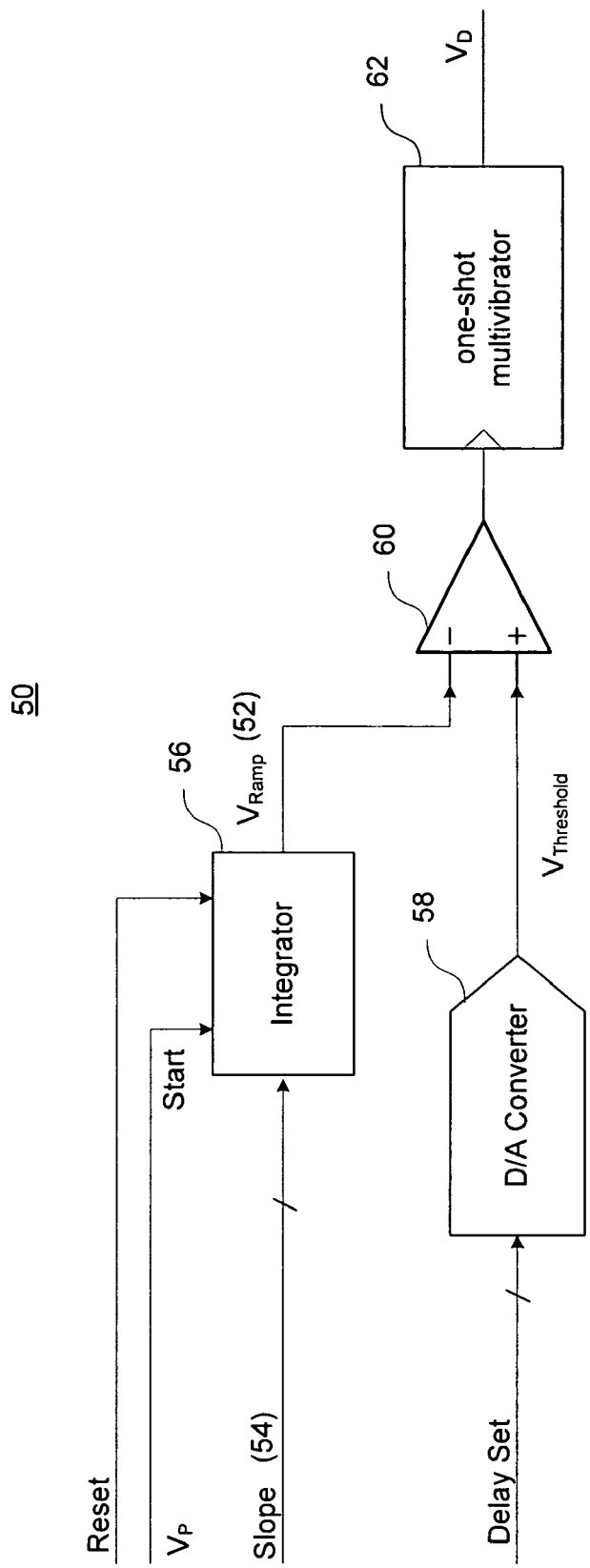
FIG. 2 illustrates a delay generator that can be employed with aspects of the present invention.

The delay generator 18 may be implemented in different ways. Examples of delay generator implementations are described in U.S. Pat. No. 6,188,261 entitled "Programmable Delay Generator and Application Circuits Having Said Delay Generator" which issued on Feb. 13, 2001 and is incorporated by reference herein. One exemplary implementation of such circuits is shown in FIG. 2. FIG. 2 shows a specific implementation of a delay generator employing an integrator 50 that starts a programmable-slope ramping voltage 52 $V_{Ramp}$ (e.g. by charging a capacitor with a constant current) after it receives a start pulse (Pulse In). The ramp slope is programmable via a slope control word 54 that determines the delay control range. Signals $V_P$ and Reset are fed to an integrator 56 in addition to the slope control word 54. Signal $V_P$ starts the integrator ramp and signal reset forces it to assume its initial value.

Figure 3:
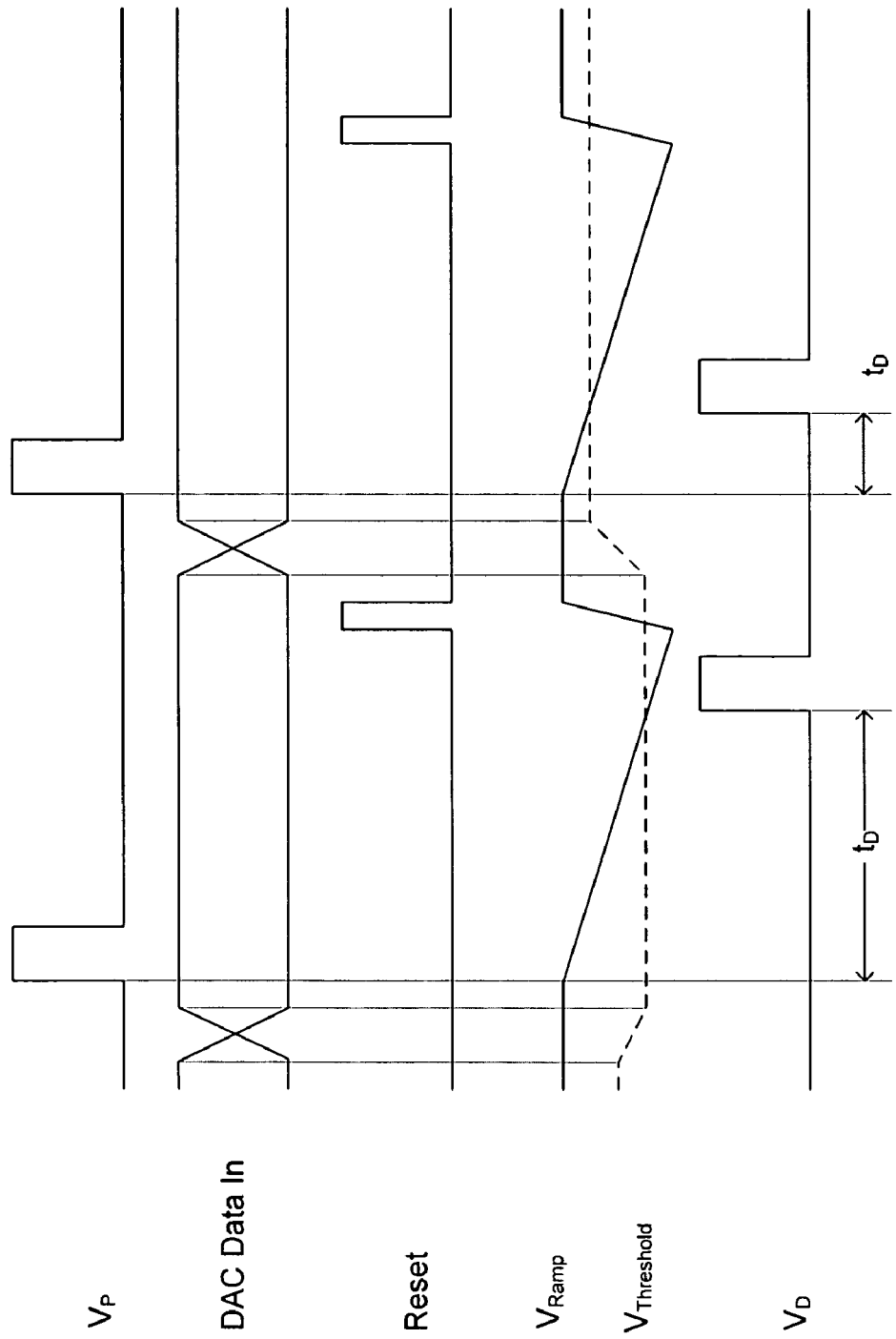
FIG. 3 shows the waveform timing relationships for the circuit of FIG. 2.

Before the input pulse is applied, a Delay-Set word (derived from delay word D) is input to D/A converter 58 which in turn provides a threshold voltage ($V_{Threshold}$). The voltage ramp $V_{Ramp}$ 52 is compared with the threshold voltage $V_{Threshold}$ by comparator 60. An output of the comparator 60 is provided to a one-shot multivibrator 62. The resultant output of one-shot multivibrator 62 ($V_D$) gets triggered each time there is a crossover of $V_D$ below $V_{Threshold}$. This crossover determines the delay ($t_D$) of the output pulse referenced to the input edge. The corresponding waveforms are shown in FIG. 3.

Returning to the embodiment of FIG. 1, for the DDS to operate as desired, the applied delay should be a fraction of the $f_{OSC}$ period. At the $n^{th}$ $V_P$ pulse, the applied delay should ideally be $D_{n-1}/2^{N_A}*1/f_{OSC}$, where $D_{n-1}$ was the value of the NCO output word at the previous overflow (n-1$^{th}$ $V_P$ pulse). Depending on the actual implementation of the DDS, $N_D$ can equal $N_A$ or just be a fraction of it (i.e. $N_A \geq N_D$). In any case, the words D and A are related as follows:

$$D = A/2^{(N_A-N_D)} \quad (4)$$

Therefore, the correction delay added to the $n^{th}$ $V_P$ pulse edge is $T_{c(n)} = D_{(n-1)}/2^{N_D}*1/f_{OSC}$. If $N_A > N_D$, the residual error $\Delta T_{corr} = [D_{(n-1)}/2^{N_D} - A_{(n-1)}/2^{N_A}]*1/f_{OSC}$ results in deterministic quantization noise, and therefore deterministic frequency jitter on the DDS output signal. Note, one skilled in the art would realize that the operation of the overall embodiment of FIG. 1 remains unchanged if the delay has one or more but generally less than P-2 $f_{OSC}$ periods added to all of the delay values.

In addition to the selected portion of the accumulated phase value A and OVF, the delay control circuit also could receive signal $f_{OSC}$ from the reference oscillator 12 as this could enhance the delay accuracy. $V_P$ is also optionally provided to the delay generator circuit 18. Since the more timing information that is provided to the delay generator, the better it will perform, FIG. 1 illustrates the delay control with inputs of $V_P$ and $f_{OSC}$. The delay control 26 uses the truncated accumulator output value D, the value OVF and optionally, $V_P$ and $f_{OSC}$ to perform delay correction on $V_P$ that essentially shifts the $V_P$ pulses by a fraction of the $f_{OSC}$ period according to the previous NCO output word. The resultant signal $V_D$ is a phase corrected signal.

The output frequency is given by the following relationship: $f_{OUT} = f_{OSC}/(P+K/2^{N_A})$ where $f_{OSC}$ is the reference oscillator frequency, P is the dual modulus divider base ratio, K is the NCO accumulator increment, and $N_A$ is the NCO word length.

The frequency synthesis resolution is given as:

$$\Delta f = f_{OSC}*(1/P - 1/(P+1/2^{N_A})) \quad (5)$$

The average frequency deviation over M $V_D$ output pulses is defined as:

$$\Delta f = 1/M * \Sigma(|f_{inst(n)} - f_{OUTideal}|) \quad (6)$$

where $f_{inst(n)}$ is the instantaneous frequency of the corrected pulses after the phase correction has been applied. This is given as:

$$f_{OUT} = 1/T_{D(n)} = 1/[t_{D(n+1)} - t_{D(n)}] = 1/[T_{P(n)} + T_{OSC}/2^{N_D}*(D_{(n)} - D_{(n-1)})] \quad (7)$$

Where $t_{D(n+1)}$ and $t_{D(n)}$ are the delay-corrected output pulse edges at instances n+1 and n, corresponding to delay correction words $D_{(n)}$ and $D_{(n-1)}$ and $T_{P(n)}$ is the period of the P divider output at the $n^{th}$ instance.

It can be seen in FIG. 1 that NCO 16 is clocked by the dual modulus divider output signal $V_P$ to provide a delay correction value to the delay generator circuit 18. As will be discussed in more detail below, an optional binary frequency divider 104 shown in FIG. 6 may provide a fixed binary frequency division while it will also correct the duty cycle of the output waveform ($f_{OUT}$). As the reference oscillator signal at frequency $f_{OSC}$ in FIG. 1 is operated on by programmable divider 60, the frequency of $V_P$ is necessarily lower than $f_{OSC}$.

In fact, the higher the $f_{OSC}/f_{OUT}$ ratio, the finer the $f_{OUT}$ frequency synthesis resolution for a given NCO word length as shown above. The advantage of a high $f_{OSC}/f_{OUT}$ ratio is that the delay generator and the NCO now operate at a much lower rate than in conventional phase-interpolating DDS architectures and therefore the circuit architecture of FIG. 1 features reduced power consumption over these DDS implementations. Furthermore, in FIG. 1, interpolation by the delay generator circuit (phase interpolator) 18 occurs at lower speeds, which offers a significant improvement over the prior art as the lower clocking speed results in a lower power dissipation.

The output pulse $V_D$ has a duty cycle that depends on the synthesized frequency $f_{OUT}$. Optionally, a toggle Flip-Flop (T-FF) with an output of half the frequency ($f_{OUT}/2$) or other latching mechanism can be used to produce a duty-cycle corrected version of the synthesized output frequency signal.

Figure 4:
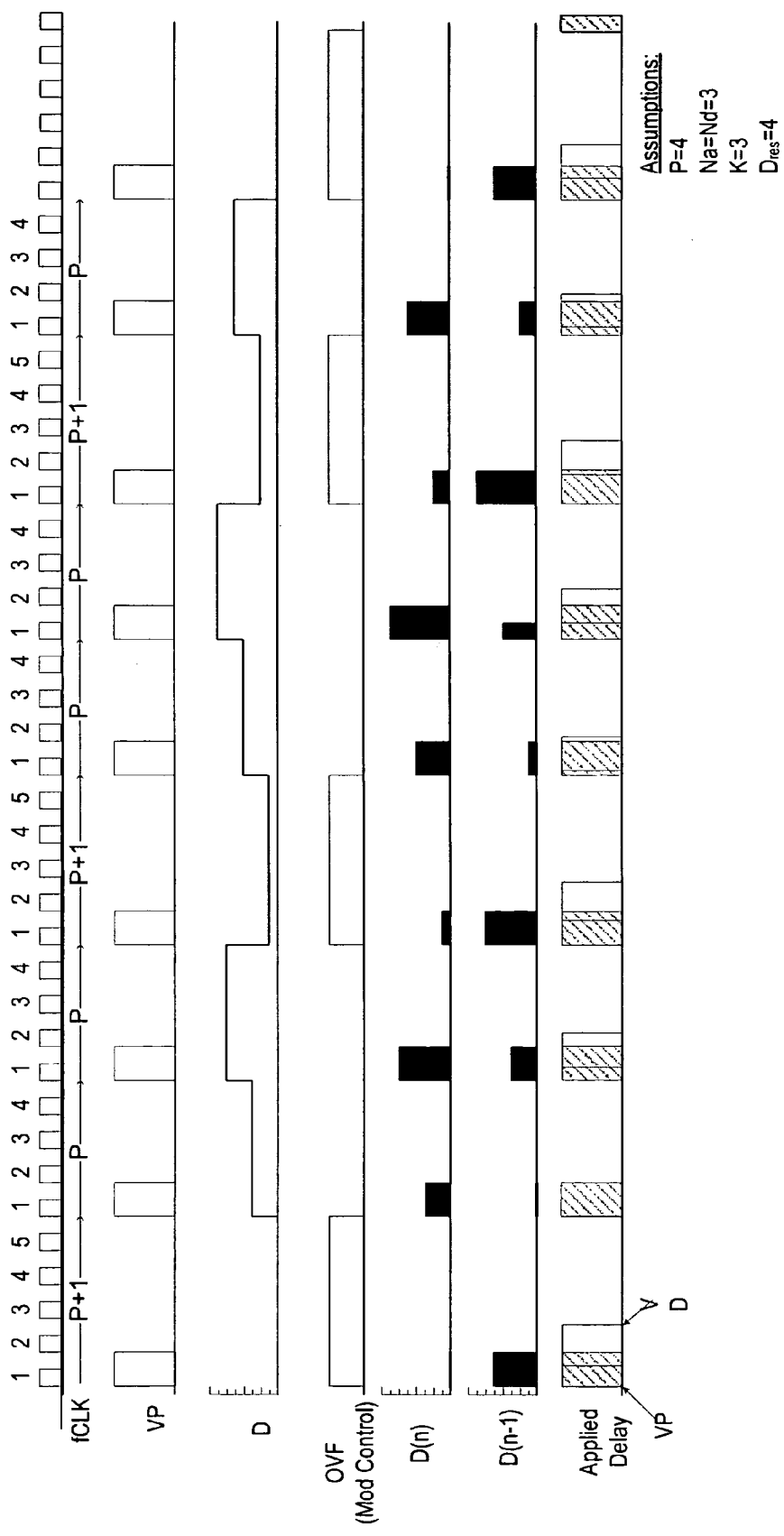
FIG. 4 is an exemplary timing diagram for the direct digital synthesis block diagram of FIG. 1.

FIG. 4 is a timing diagram showing an example of operation of the circuit architecture of FIG. 1. FIG. 5A is a table that illustrates the behavior of the system described in FIG. 4. A number of signals are shown in the plots illustrated in FIG. 4. Before addressing the various plots, it is important to understand that certain parameters associated with the architectures have been selected in this example for illustrative purposes. For instance, the divider modulus base value (P) has been set to 4. This means that unless there is an overflow, four $f_{OSC}$ pulses are typically passed before a $V_P$ pulse comes from the programmable divider 18. When an overflow occurs, the divider counts 5 $f_{OSC}$ pulses before a $V_P$ is produced. A larger value of P results in a lower output frequency. While P has been set to a value of 4 in this example, it should be understood that P may be any integer value. P may be set at manufacture to a specific value or range of values depending upon operating conditions.

By way of example only, P may be any integer from 3 to 30. Said another way, the larger the value of P, the better control and finer resolution there is over the synthesized output signal $V_P$.

In the example of FIG. 4, the word length $N_A$ of the NCO accumulator 16 is selected to be 3 bits. This provides a maximum value of A to be 7. A larger word length $N_A$ will result in a finer $f_{OUT}$ resolution as described above. The resolution of the accumulator output value determines the resolution of the phase correction word. In other words, the precision of the ratio of the accumulator increment to the full-scale range determines the time-scale granularity of the $f_{OUT}$ pulse edges. Another value set in this example is the word length of the delay being applied, which here is shown to be equal to $N_D$.

As mentioned above, in general $N_A \geq N_D$. The value of $N_A$ determines the granularity of the average frequency programming as shown above through the ratio $K/2^{N_A}$. As the instantaneous frequency of signal $V_P$ will vary between $f_{OSC}/P$ and $f_{OSC}/P+1$, the value of $N_D$ determines the effectiveness of the phase interpolation which ultimately determines the phase jitter (or Phase Noise) of the synthesizer.

Obviously, the larger the NCO word length the finer the output frequency synthesis resolution. For example, in a practical frequency synthesis application with a $f_{OSC}$ frequency in the neighborhood of 2 GHz, if one wants to generate any arbitrary frequency with an accuracy of 1 PPM in the range of 400 to 500 MHz the P divider should be set up for division-by 4 or 5, while a word length $N_A$ greater than 18 bits should be used. In this particular application, given that the instantaneous value of the frequency $f_{V_P}$ will be switching between 400 and 500 MHz and given the current state of the art of delay generator designs, and given that implementations of digital to delay converters with larger $N_D$ values become exponentially more complex and consume exponentially more power (i.e. the more bits, the more complicated, with, for example, 6 bits being more complicated than 4 bits and 9 bits more complicated than 6 bits, etc.), $N_D$ would be chosen considerably smaller than $N_A$ in this case. In particular, the value of $N_D$ will generally be set as small as possible while still achieving sufficient cycle-to-cycle jitter performance and sufficient high frequency phase noise performance for the target application.

The rate of overflow is dependent on the accumulator increment value K. The rate of overflow affects how the delay value applied to the phase interpolator varies (note that it can only be greater than zero). In this example, the increment value, K, is set at 3. The ratio of K to $2^{N_A}$ determines the effective divide ratio of the synthesizer (i.e. fractional division). As K assumes values in the range of 0 to $2^{N_A-1}$ the output frequency $f_{OUT}$ ranges from $f_{OSC}/(P+2^{-N_A})$ to $f_{OSC}/(P+1-2^{-N_A})$.

In the timing diagram of FIG. 4, the topmost plot shows the waveform output by the reference oscillator. The frequency of the reference oscillator output is $f_{OSC}$ as shown.

The second plot from the top shows the waveform of signal $V_P$ output by multi-modulus divider 14. As discussed above, $V_P$ is provided to the delay generator 18, as well as to D-FF 22 of the NCO 16. The timing of the pulses $V_P$ depends upon the multi-modulus divider 14 toggling between P and P+1. Signal $V_P$ sets the NCO operational frequency.

In FIG. 4, the third plot from the top presents the value of the accumulator output word (D), which produces the delay control word to be applied to $V_P$. A delayed version of this value is applied to the delay generator as described below.

The fourth plot from the top shows the overflow signal OVF which issues from holding or latching circuit 22. The OVF signal controls the division ratio (modulus control) of multi-modulus divider 14. It is also input into delay control circuit 26 of the delay generator 18. As shown in FIG. 4, OVF lasts for one $V_P$ cycle every time it is triggered. The accumulator values that cause the overflow are set forth in the table in FIG. 7A. Note, in this example, the overflow value causes the P value to change from P to P+1 which causes the $T_{osc}$ count to increase from 4 to 5. The increment of $t_p$ and the value of $T_P$ also increase in duration during overflow.

The fifth plot from the top shows a signal representing the delay value $(D_{(n)})$, which is output by the accumulator 20. In the present example, this signal may range from a value of zero to a value of 7. Other values may be selected depending upon a design choice for various operating conditions. For K=3, the leftmost delay value is zero, while the next delay value is 3, the third delay is 6, the fourth delay is 1, the fifth delay is 4, the sixth delay is 7, the seventh delay is 2, the eighth delay is 5 and the ninth delay is 0.

The sixth plot from the top presents delay value $(D_{(n-1)})$ applied to delay generator/phase interpolator 18 via signal D output from holding/latching circuit 22 of NCO 16. It can be easily observed that the $D_{(n-1)}$ are staggered by one $V_P$ cycle relative to $D_{(n)}$.

Finally, the seventh plot from the top presents a pulse train showing the delay-compensated output pulse signal $V_D$ of FIG. 1, in relation to signal $V_P$. Referring to FIG. 5A it is observed that the increments of $t_D$ are uniform, and the effect of the uniform values of $t_D$ results in a uniform value for $f_{out}$. As noted from FIG. 3 $t_D$ is the time delay applied to the pulse $V_D$ relative to the pulse edge for $V_P$. FIG. 5B illustrates the effect of a change in the value of $N_A$ and K from 3 (in FIG. 5A) to 4 and 7, respectively, in FIG. 5B. In addition to a change in the increments for an overflow to occur, FIG. 5B illustrates that $T_D$ and therefore $f_{out}$ oscillates between two values. FIG. 5B illustrates a system operation where the input increment $K \approx 2^{N_A-1}$. In this example, the K increment (7) is approximately equal to $2^{4-1}$ (i.e. 8). As stated below, it is preferred if K does not assume values at or near the limits of its range of values.

As explained above with regard to FIGS. 1 and 4, the edge-corrected $V_D$ pulses can be duty-cycle corrected by passing them through a device such as a toggle flip-flop or a binary frequency divider, as will be described in more detail below with regard to FIG. 6.

Figure 6:
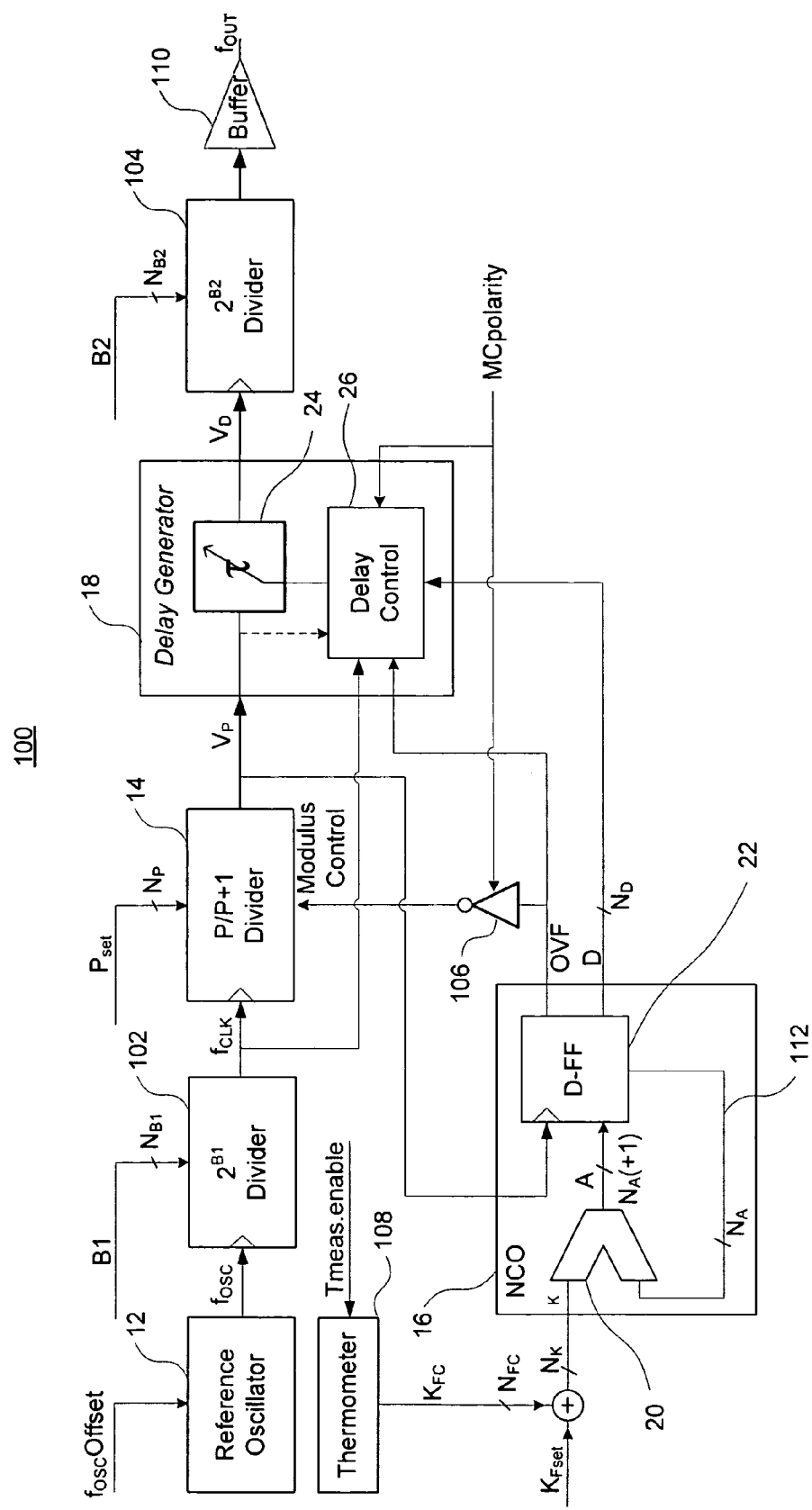
FIG. 6 illustrates an alternative embodiment of the invention.

FIG. 6 is a schematic illustration of an alternative embodiment of the invention. It illustrates a multi-modulus divider direct digital synthesizer architecture 100 in accordance with aspects of the present invention. The architecture 100 includes many of the same components as the architecture of FIG. 1, which operates in the manner discussed above. For instance, the reference oscillator 12 produces a waveform with a frequency $f_{OSC}$. In the present embodiment the reference oscillator 12 also includes a frequency offset control function $f_{osc}$.Offset that causes the frequency $f_{OSC}$ of its output signal to be shifted by a given amount (e.g. 2%). The architecture 100 also includes the multi-modulus programmable divider 14, programmable NCO 16, and delay generator circuit 18.

As shown in FIG. 6, the architecture 100 preferably also includes two programmable binary dividers 102 and 104, a programmable modulus control inverter 106, and a temperature sensing unit such as digital thermometer 108. The digital thermometer 108 may receive a signal Tmeas.enable as shown in the figure. This signal may enable/disable measurement by the thermometer 108.

The reference oscillator frequency $f_{OSC}$ can be optionally divided using the binary divider 102 to a lower master clock frequency $f_{CLK}$ to enable lower power consumption but provides cruder delay resolution (i.e. introduces more jitter). The binary divider 102 receives signal $f_{OSC}$ from the reference oscillator 12 and outputs a signal of frequency $f_{CLK}$, which is provided to the multi-modulus programmable divider 14 as well as the delay control circuit 26 of delay generator 18. The binary divider 102 divides down the oscillator frequency $f_{OSC}$, e.g., by a selectable but fixed integer value (B1) to generate $f_{CLK}$. This provides reduced power dissipation, as the DDS operates now at a reduced speed, while it also increases the total delay range that must be covered by the phase interpolator. This typically degrades the absolute jitter performance of the phase interpolator because digital-to-time converters, like digital-to-analog data converters tend to have a fixed ratio between the magnitude of the absolute errors and the full scale range doubling the maximum delay which the phase interpolator must provide will, to first order, double the absolute value of the maximum errors in the delay. Note that, in this embodiment, the input into the multi-modulus divider 14 is $f_{clk}$ and not $f_{osc}$ (as in FIG. 1). In this embodiment $f_{clk}$ is optionally input into delay control 26.

The multi-modulus divider 14 is preferably synchronous with the reference oscillator 12. As discussed above with regard to FIG. 1, the output of the multi-modulus divider 14 is signal $V_P$. The parameters B1 of the binary divider 102 and $P_{set}$ of the multi-modulus divider 14 are used to set a coarse frequency range for $V_P$, which also is the operational frequency of the delay generator 18. The frequency of $V_P$ is related to $f_{OSC}$ as follows:

$$F_{Vp}=f_{OSC}/(2^{B1}P_{set})=f_{CLK}/P_{set} \quad (8)$$

where $P_{set}$ can be P or P+1 as determined by the modulus control signal MC. The setting of B1 effectively enables a trade-off between noise performance (i.e. jitter) and power consumption.

As shown in FIG. 6, input signal K is provided to the accumulator 20 of NCO 16. K is composed of a $K_{Fset}$ word along with an additional correction value $K_{FC}$ originating from the digital thermometer. As explained above, the resulting increment K is used to determine the rate of overflows and subsequently defines how many $V_P$ pulses are counted by the programmable divider 18. The output A of accumulator 20 is a delay value $D_{(n)}$ and an overflow signal. A latching circuit such as a bank of $N_A$+1 data flip-flops ("D-FF") 22 in the NCO 16 updates the output value of the accumulator 20, shown as signal A at specified intervals. The accumulator output values A (i.e. the phase delay values) are optionally truncated into values D which are provided to delay control circuit 26 of the delay generator 18 along with an overflow signal OVF, the master clock signal $f_{CLK}$ and optionally the signal $V_P$. As previously noted, it is advantageous, but not required, to provide $V_P$ and the signal input into the multi-modulus divider ($f_{CLK}$ in FIG. 6) to synchronize the delay generator to the $V_P$ pulse.

As shown, $V_P$ is also provided to the delay generator circuit 18. The delay control 26 uses the accumulated value D and OVF $f_{CLK}$ to perform delay generation on $V_P$ and to output a resultant signal $V_D$, which is a corrected $V_P$ signal. Delay control 26 uses optional inputs $f_{clk}$ and $V_P$ to synchronize the delay generator with $V_P$. $V_D$ is provided to the binary divider 104. As with the binary divider 102, an input to the binary divider 104, B2, may be a user-specified or predetermined input that sets the binary division ratio at the output of the delay generator 18. The binary division ratio is controlled through a B2 programming word supplied to the binary divider 104. A buffer 110 may be employed to isolate the operation of the DDS from a variety of external loads (not shown). The resultant output is a signal $f_{OUT}$.

As discussed above, coarse adjustments of the output frequency can be primarily determined through programming words to the binary frequency dividers 102 and 104. This range of frequencies is also governed by the range of values for $P_{set}$ in the multi-modulus P/(P+1) divider 14. To those skilled in the art it is obvious that if the selected range of possible P/(P+1) values spans an octave, i.e., max($P_{set}$) >2*min($P_{set}$), in combination with a programmable binary divider such as B2, the system can yield a multi-octave output frequency ($f_{OUT}$) coverage. While programmable dividers 102 (B1) and 104 (B2) are not required to be binary, the use of other integer dividers require more power consumption and do not provide for duty cycle correction.

Additional frequency control can be had through the configuration of the divider modulus control polarity MCpolarity applied to the programmable modulus control inverter 106. In the previous embodiments ($MC_p$=0) it has been assumed that an overflow OVF condition causes the dual modulus divider to divide by P+1. In this case, the output frequency in the architecture of FIG. 6 is given by the following relationship:

$$f_{OUT}=f_{OSC}/2^{B1}*1(P+K/2^{NA})/2^{B2} \quad (9)$$

If MCpolarity is set so that during regular NCO increments the multi-modulus divider 14 divides by P+1 and during overflows it divides by P ($MC_p$=1) then the output frequency is:

$$f_{OUT}=f_{OSC}/2^{B1}*1/(P+1-K/2^{NA})/2^{B2}. \quad (10)$$

This configuration also requires that the delay compensation word is bit inverted (i.e. $D_{MCp=1}$=1−$D_{MCp=0}$) So that maximum delay settings correspond to pulses resulting from division by P+1. The frequency coverage dependence on the MCpolarity signal is illustrated in FIG. 8B.

Fine adjustment of the output frequency is controlled by K as explained above. The increment word K of word length $N_K$ is input to the NCO accumulator 20 and determines how fast the accumulator output A advances for each clock pulse $V_P$ generated by the programmable multi-modulus divider 14. Depending on the application, the increment K can be fixed at $K_{Fset}$ producing a fixed output frequency or can be dynamically adjusted producing phase or frequency deviations of the output signal.

FIG. 6 shows the increment K as a sum of the programming words $K_{Fset}$ and $K_{FC}$ with word lengths $N_{Fset}$ and $N_{FC}$, respectively. While $K_{Fset}$ is one-time programmed during the manufacturing process to determine the nominal output frequency $f_{OUT,nom}$, the frequency correction word $K_{FC}$ is updated periodically to correct the output frequency for possible drifts of $f_{OSC}$ due to temperature fluctuations as measured by the thermometer 108. The intermittently-operated thermometer 108 may include an accurate temperature sensor, an analog-to-digital converter and a numerical circuit that produces a supplementary correction value that modifies the effective synthesizer division ratio as follows:

$$f_{OSC}/f_{OUT}=2^{B1+B2}*(P+[K_{FSet}+K_{FC}]2^{N_A}) \quad (11)$$

If $f_{OSC}$ drifts due to a difference in temperature by an amount $\Delta f_{OSC}$ then the output frequency will also drift as follows:

$$f_{OUT}+\Delta f_{OUT}=(f_{OSC}+\Delta f_{osc})*2^{-(B1+B2)}/(P+[K_{Fset}+K_{FC}]/2^{N_A}) \quad (12)$$

To eliminate the output drift the correction increment should be:

$$K_{FC}=\Delta f_{OSC}/f_{OSC}*(P*2^{N_A}+K_{Fset}) \quad (13)$$

A variety of temperature-to-increment converters and drift correction mechanisms can be implemented in this block.

Alternatively, $K_{Fset}$ can be dynamically adjusted according to a phase modulation word (not shown) to produce an output signal featuring continuously variable phase and/or frequency. In this case, a separate phase modulation controller would be inserted at the $K_{Fset}$ input of the adder before the NCO 16.

Figure 7A:
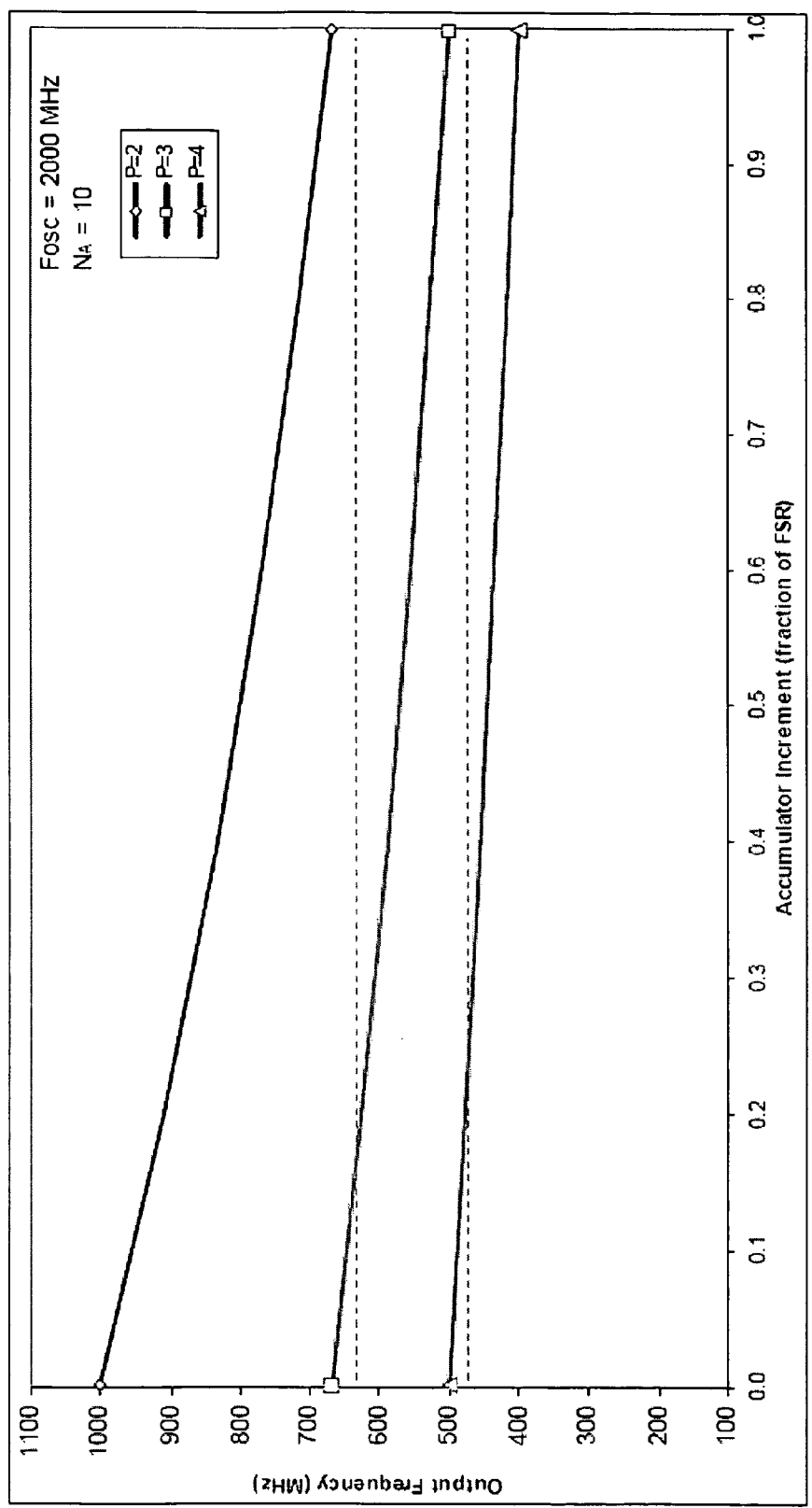
FIGS. 7a and 7b show details of an exemplary frequency plan of a preferred embodiment of the present invention.

FIG. 7a shows an exemplary frequency plot for a preferred embodiment with B1=1, B2=1, and P having values of 2, 3 and 4. Also $f_{OSC}$=2000 MHz and $N_A$=10. It can be easily seen that no gaps in $f_{our}$ coverage (a range of about 500 MHz to 1000 MHz) exist as P transitions through various values. It should also be understood that these values for B1, B2, P, $f_{OSC}$ and $N_A$ are merely illustrative and do not limit the scope of the invention.

Figure 7B:
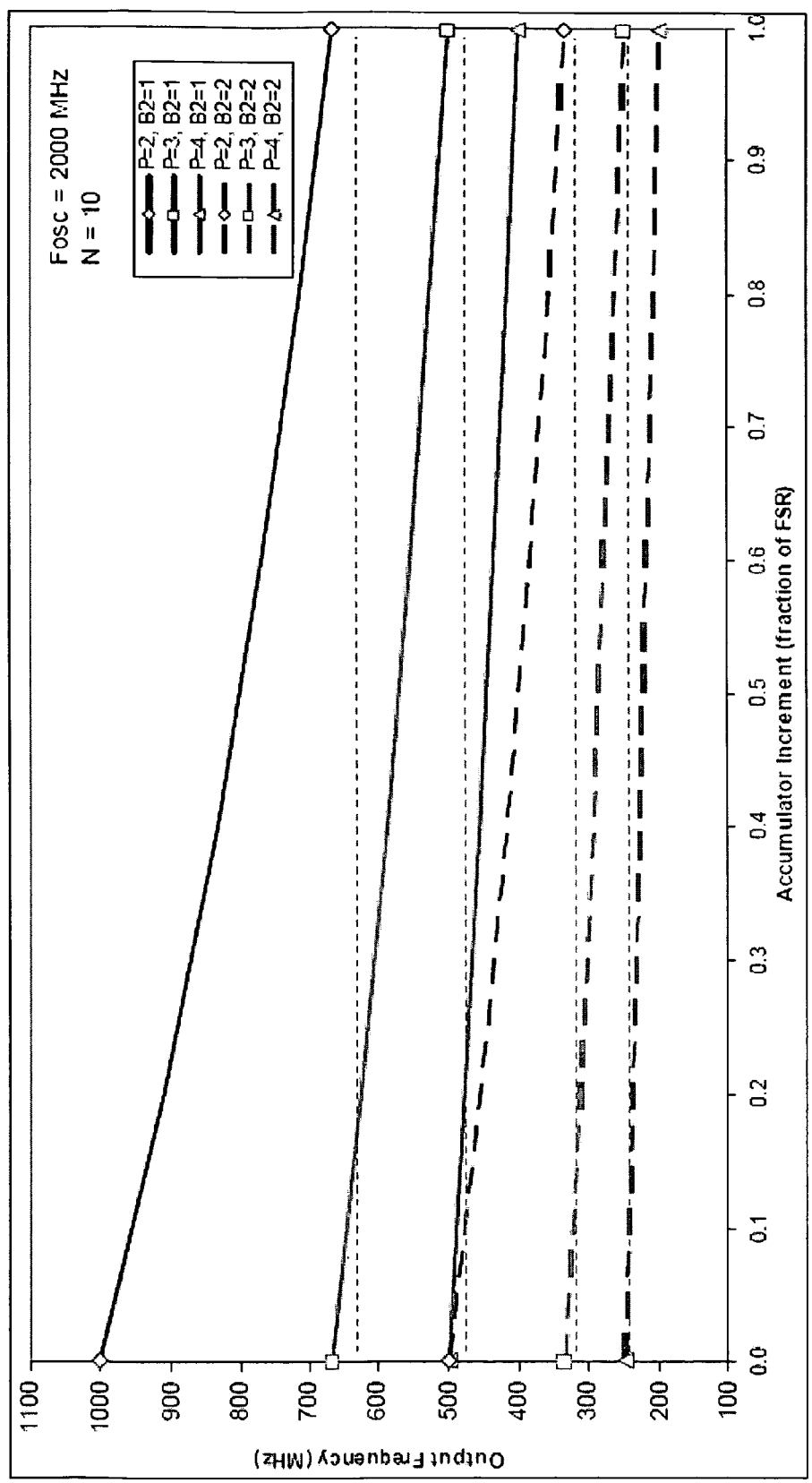

FIG. 7b shows another exemplary frequency plan for a preferred embodiment with B1=1, B2=1 and 2, and P=2, 3 and 4. And as with FIG. 7a, $f_{OSC}$=2000 MHz and $N_A$=10. It can be easily seen that the output coverage (a range of about 250 MHz to 1000 MHz) is expanded by an additional factor of 2 by setting the output divider to divide by 2 (i.e., when B2=2).

Figure 8A:
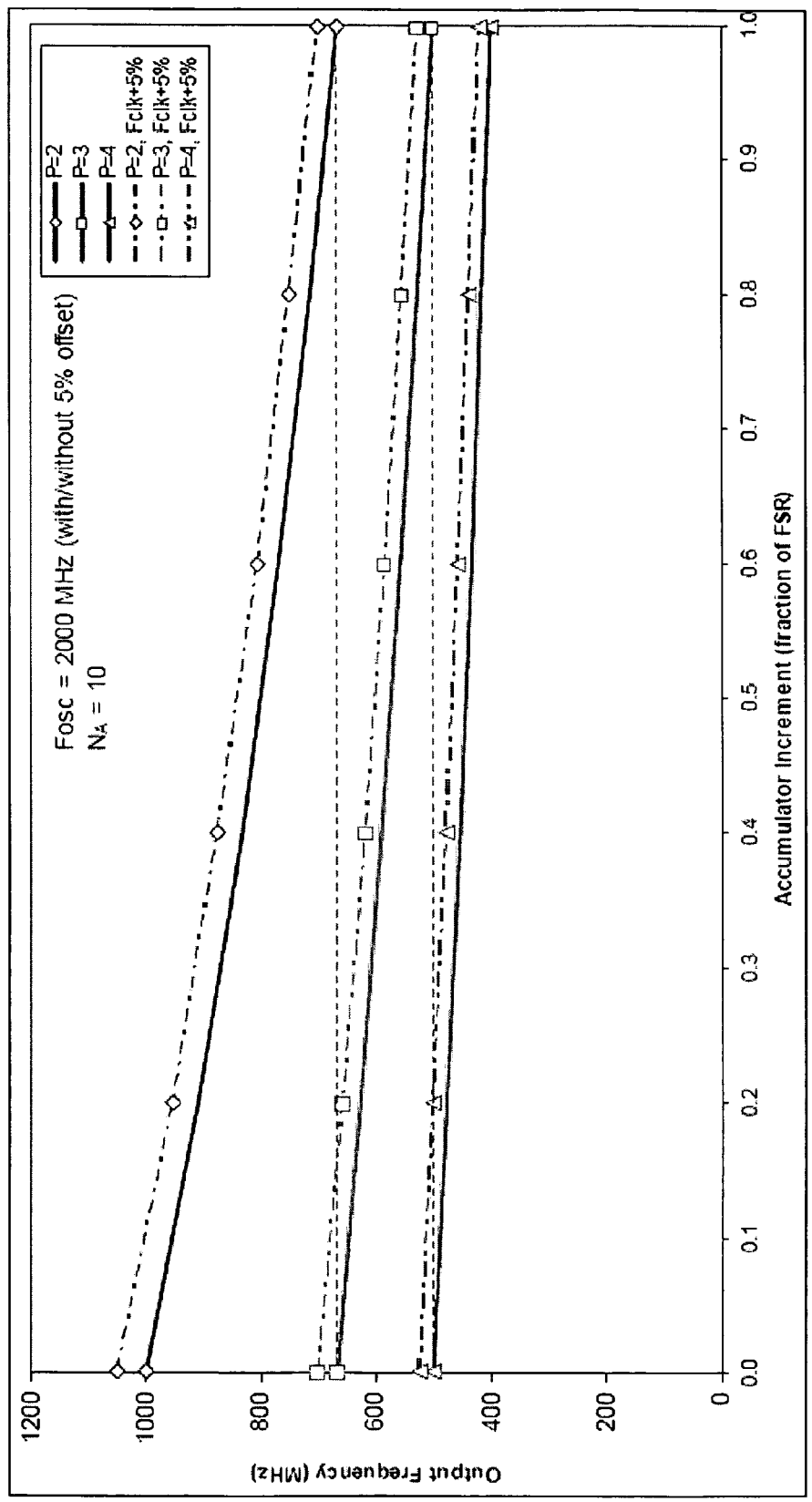
FIG. 8a shows the role of the $f_{OSC}$OFFSET setting of the reference oscillator in the frequency planning of a preferred embodiment.
Figure 8B:
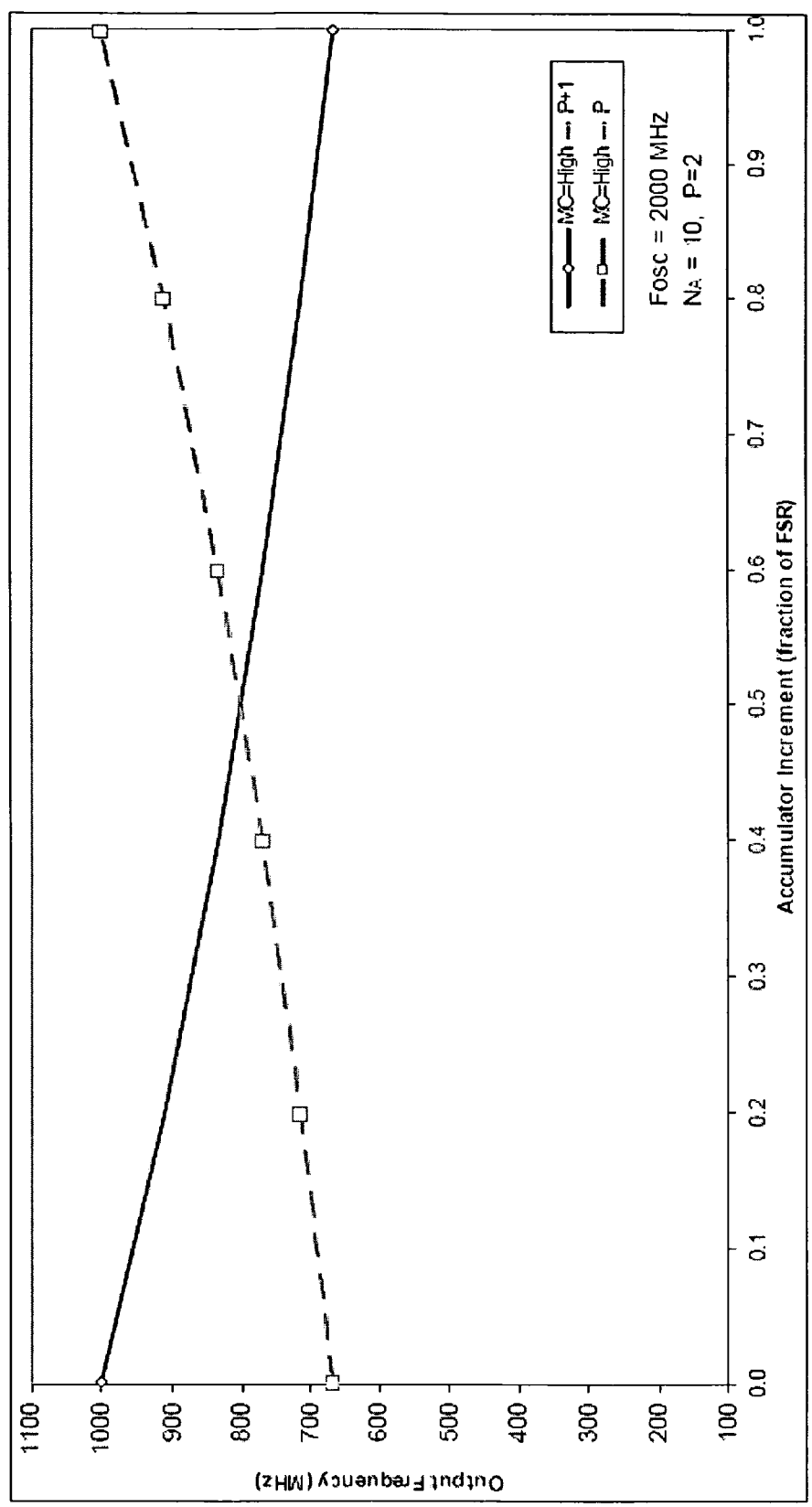
FIG. 8b illustrates the functionality of a MCpolarity setting in accordance with aspects of the present invention.

FIG. 8a illustrates the use of the oscillator offset function $f_{OSC}$Offset. This setting shifts the frequency of the reference oscillator $f_{OSC}$ by a small amount (e.g. less than ~2%) and may be programmed during the manufacturing of the product. It can be easily seen that this option can enable alternative output frequency coverage around the boundary frequencies for different P divider settings.

FIG. 8b illustrates the effects of the MCpolarity setting in the frequency selection. The output frequency is plotted against the normalized K value for both configurations of the MC polarity. It can be easily seen that one curve is the inverse of the other. As the two MC polarity settings configure both the programmable divider and the delay generator in complementary ways, they provide diversity in selecting the output frequency.

Figure 9:
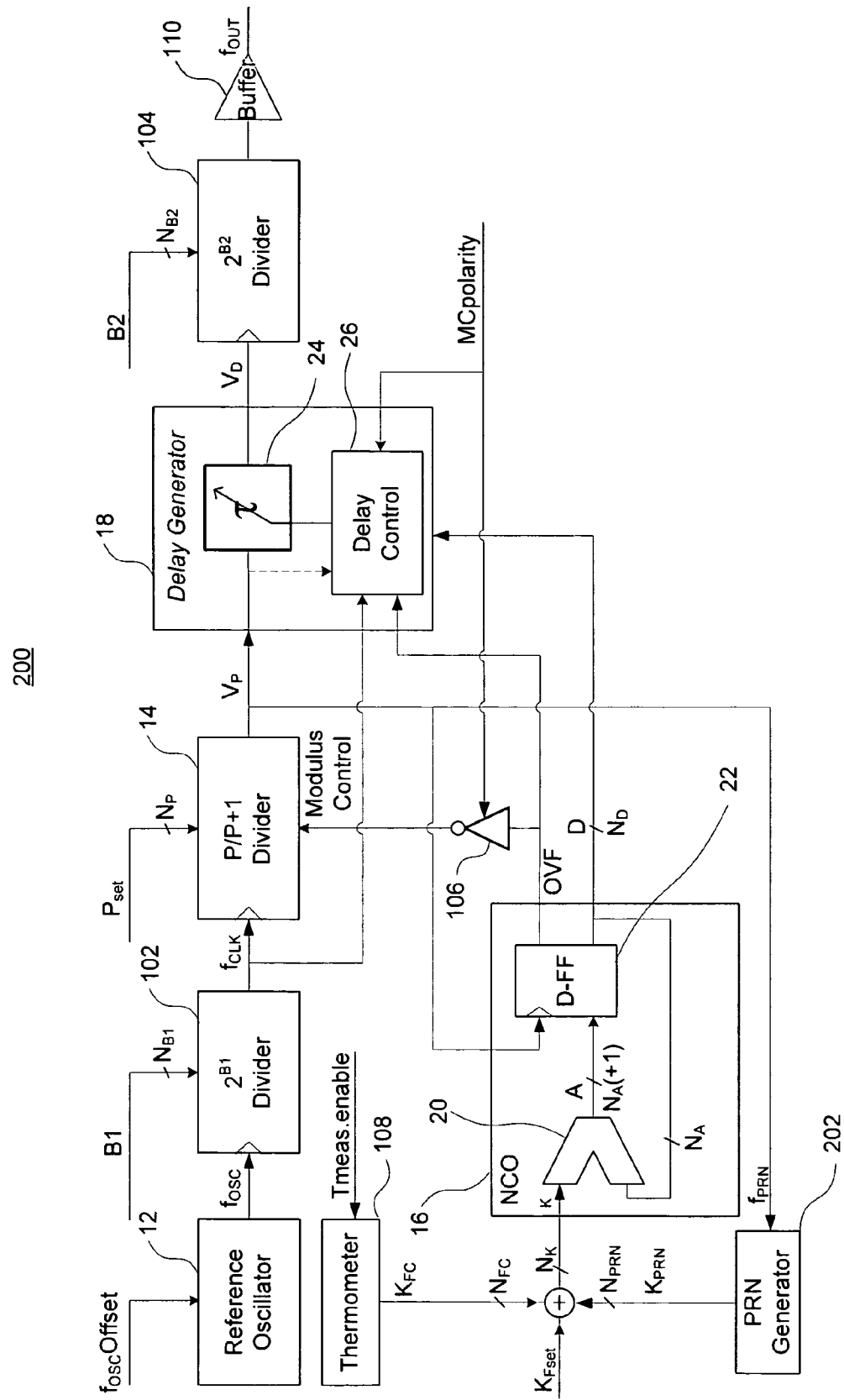
FIG. 9 illustrates an alternate embodiment of the invention that employs a digitally generated randomization signal to create a controlled spread-spectrum reference frequency output.
Figure 11:
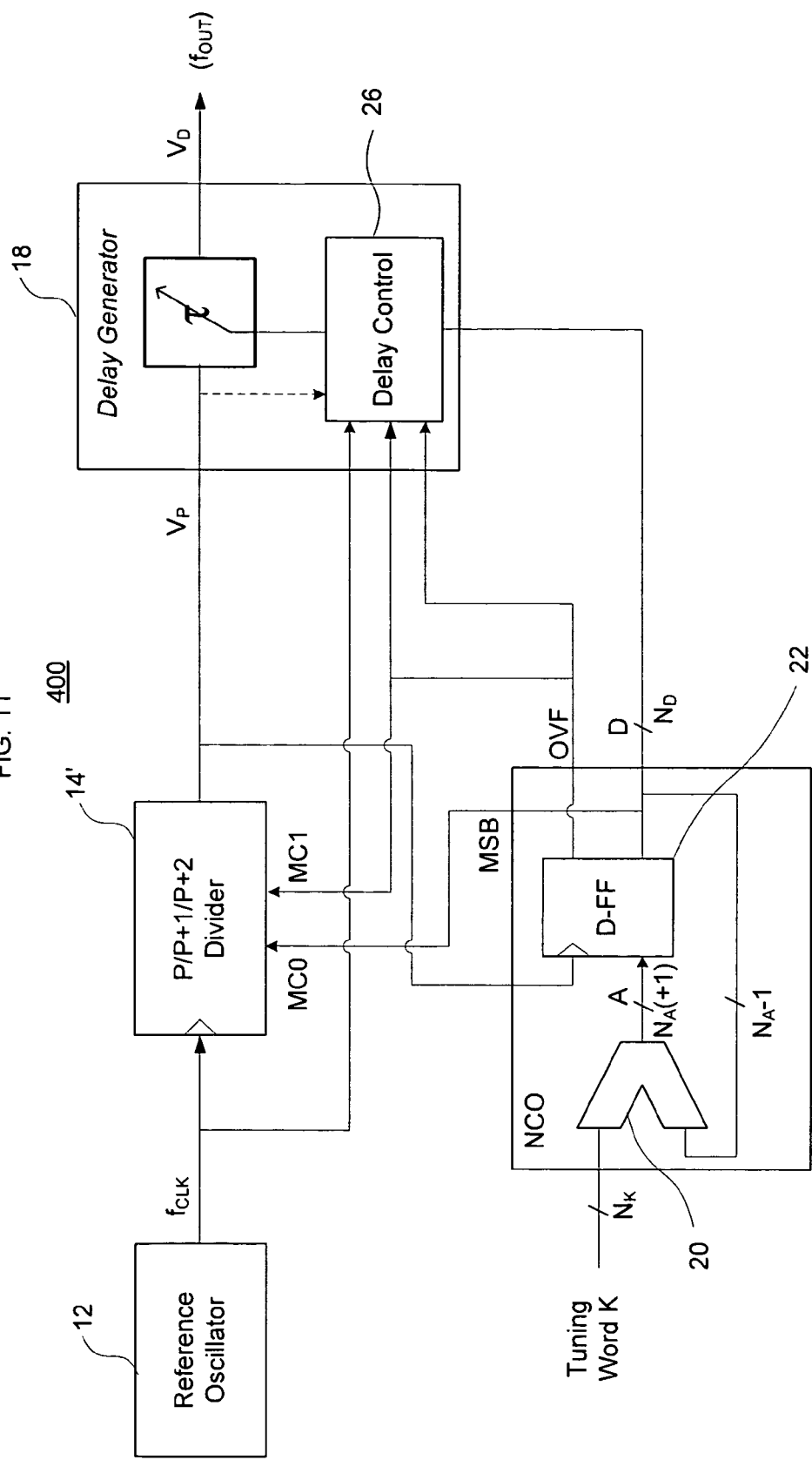
FIG. 11 illustrates another alternate embodiment of the invention that utilizes a triple-modulus divider.

FIG. 9 is a schematic illustration of an alternate embodiment of the invention. It illustrates a multi-modulus divider direct digital synthesizer architecture 200, which incorporates many of the elements shown and described with regard to FIGS. 1 and 8. FIG. 11 further includes a Pseudo-Random Noise ("PRN") generator 202 that produces a dynamically variable (dithering) accumulator increment. This in turn results in a phase-dithered output delay word that applies a controlled noise-like phase correction to the VP signal. This noise-like phase addition "frequency-spreads" any discrete spurious signals and thus reduces their amplitude. The coherence of the $f_{OUT}$ instantaneous frequency fluctuations is reduced by this random jitter process that also features a zero-mean. The PRN generator is clocked by the VP signal and has a word length $N_{PRN}$ of a few least significant bits of the word length $N_A$. One skilled in the art is aware of different approaches for the construction of PRN generators. One example is a linear code sequence generator that can be made up of any set of delay elements in conjunction with linear combining elements in a feedback path such that the number of states the generator can assume is a function of the length (in time) of the delay elements and the particular combination of feedback. These structures are referred to as Linear Feedback Shift Registers (LFSR). One skilled in the art can readily integrate such structures into a circuit. The resulting pseudo-random instantaneous output frequency jumps are as shown below:

$$f_{OUT}(n)=f_{OSC}*2^{-(B1+B2)}/(P+[K_{Fset}+K_{PRN}(n)]/2^{N_A}) \quad (14)$$

where $f_{OUT}(n)$ is the output frequency at the $n^{th}$ $V_P$ instant and $K_{PRN}(n)$ is the dithering PRN increment issued by the PRN generator 202.

Figure 10:
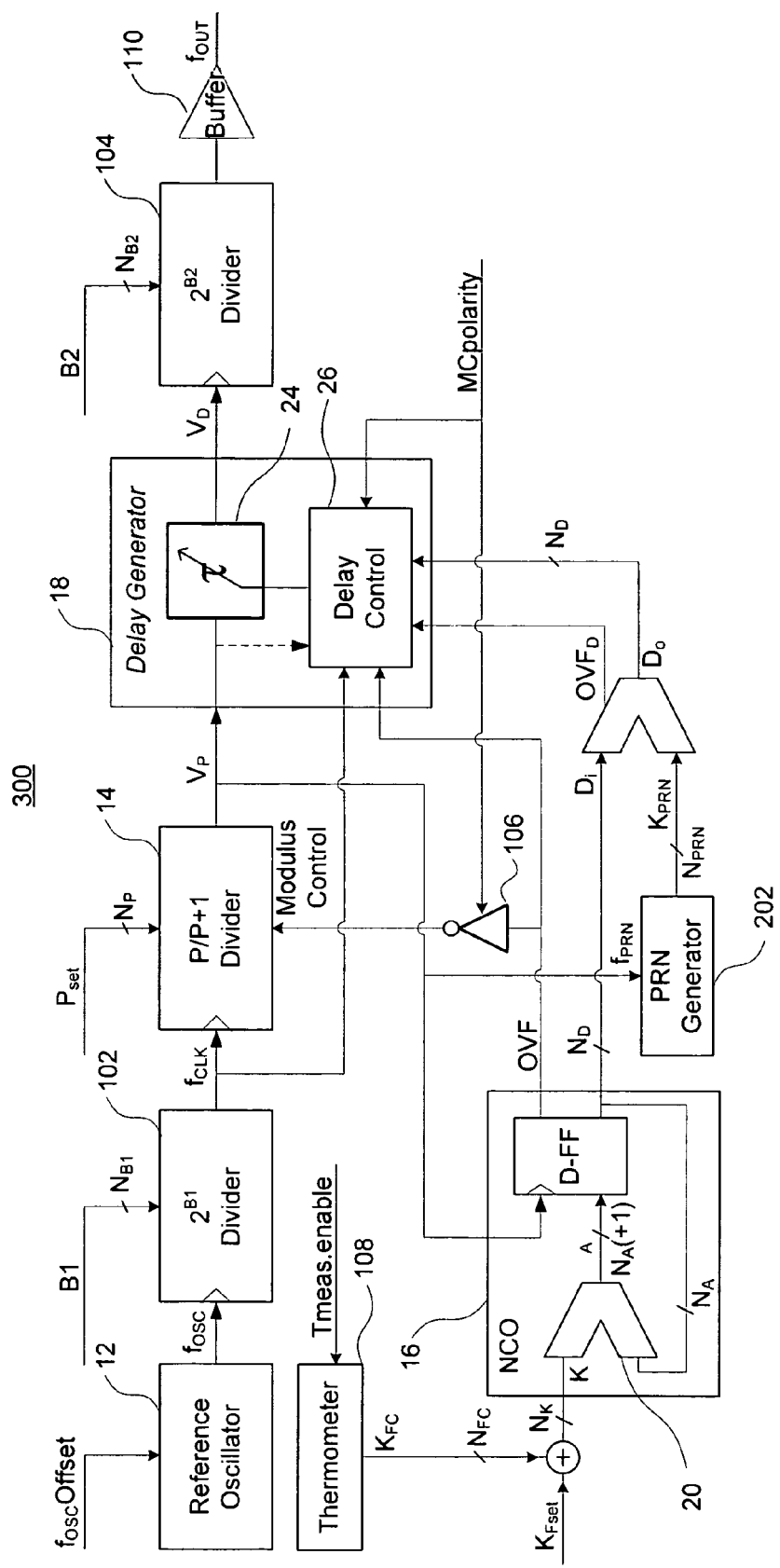
FIG. 10 illustrates yet another embodiment of the invention.

FIG. 10 depicts an alternate embodiment of the circuit of FIG. 9, in which the PRN phase increment is added at the output of the NCO 16. The adder 203 sums delay value Di and KPRN to supply the output $D_O$ along with the summation overflow bit $OVF_D$ to the delay control block 26.

Other dithering schemes are well known to one skilled in the art. One such example is described in U.S. Pat. No. 4,410,954 entitled "Digital frequency synthesizer with random jittering for reducing discrete spectral spurs," which issued on Oct. 18, 1983 and is hereby incorporated by reference.

Another application where the increment K is also modulated in a controlled fashion is in "spread-spectrum" clocks to enable the suppression of Electro-Magnetic Interference ("EMI") products in noise sensitive applications. The difference with the PRN increment dithering described above is that spread spectrum clock oscillators spread out the concentrated clock energy on their nominal output frequency to a broader bandwidth and controlled frequency range (e.g. ~1% of the output frequency). The total energy remains the same but the peak energy is spread out to near-by frequencies. It can be easily seen that spurious-randomization application dithers the K increment by small amounts (e.g. within a few LSB's of A), while reduced-EMI spread spectrum applications vary the K increment by much larger amounts (e.g. to result in ~0.5% to ~5% $f_{OUT}$ variations). The embodiments illustrate in FIGS. 9 and 10 can also implement spread-spectrum PRN functions but it is advantageous if frequency deviations do not exceed the allowed range of values of the $K/2^{N_A}$ ratio.

Thus, it can be seen that the output frequency $f_{OUT}$ for architectures implementing aspects of the present invention is dependent upon a number of parameters, including the reference oscillator frequency, the two binary divider ratios B1 and B2, the dual modulus divider ratio P, the increment associated with the accumulator, and the settings for the P modulus control polarity configuration and the $f_{OSC}$ offset setting.

FIG. 10 is a schematic illustration of another alternate embodiment 300 of the invention. It illustrates a multi-modulus divider direct digital synthesizer architecture in accordance with aspects of the present invention also shown in FIGS. 1 and 6 and 9. The only difference between the embodiments of FIG. 9 and FIG. 10 is the point where the dithering from the PRN generator 202 is inserted. The PRN 202 output is now added to the holding circuit 22 input, instead of the accumulator 20 input. The PRN word length $N_{PRN}$ is much smaller than the accumulator input/NCO output word length $N_A$. It should be noted that after the PRN addition, the word length is truncated back to $N_A$. Embodiment 300 also includes a Pseudo-Random-Generator 202 output added to the accumulator output. This embodiment can be more suitable for the purposes of further reduction in spurious signals than the embodiment illustrated in FIG. 9.

FIG. 10 is a schematic illustration of another alternate embodiment 300 of the invention. This embodiment addresses the use of the invention when temperature, spread spectrum frequency modulation, and external modulation inputs added together could cause the value of normalized K to move above its maximum value (1) or below its minimum value (0). In such applications a problem is created when the nominal value of K must be selected near its maximum or minimum value in order to set the output frequency to its desired value. To understand this problem, consider that the maximum output frequency for the architecture in FIG. 1 is $f_{osc}/P_{min}$ (the oscillator frequency over the minimum value of P) and the highest frequency of the output is $f_{osc}/(P_{max}+1)$ (the oscillator frequency over 1+the maximum value of P). By selecting the appropriate value of P and K, any arbitrary frequency between these two limits can be selected. However, the value of P and K that give a frequency are unique since K can only represent a fraction (less than 1) of an oscillator period, $T_{osc}$. Therefore, some possible output frequencies will require the normalized value of K to be near 0 or near 1. If temperature correction terms, external modulation terms, or spread spectrum modulation terms are added to K, the ratio $K/2^{N_A}$ would need to exceed the limits of 0 or 1 and the loop would fail to operate correctly. The discussion of FIG. 8a describes a method to keep the normalized value of K from being too close to either end of the (0, 1) range by pulling the oscillator frequency when $K_{Fset}$ falls too close to a limit moving the nominal value of K further from the limit.

FIG. 11 illustrates an improved structure and method for achieving this result. Instead of requiring a change in the oscillator frequency, which may compromise the oscillator's performance as a frequency reference, FIG. 11 extends the allowed normalized range of K to be from 0-2 oscillator periods instead of the 0-1 oscillator period range provided by the architecture in FIG. 1.

The embodiment in FIG. 11 operates in a way that is similar to the embodiment in FIG. 1 except that the division modulus of the multi-modulus divider 14' is now controlled by both the overflow signal OVF (MC1) (which is like the OVF from FIG. 1) and the MSB (MC0) instead of just using the OVF pulse as in the embodiment illustrated in FIG. 1. Also, only the $N_A-1$ lower bits from the NCO output word are used for delay compensation and feedback to the accumulator input. For example, for the embodiment in FIG. 1, when the phase accumulator 20 output is 16 bits, 1 bit (OVF) is fed to the multi-modulus divider 14' and retired and the remaining 15 bits are added to K in the accumulator 20 to form the next accumulator 20 output. In FIG. 1, K is also a 15 bit binary word (i.e., it ranges from 1 up to 32,767); therefore, the sum of K and the 15 bit fed back remainder is a 16 bit word that can take on all possible 16-bit values, 0-65,535. In the embodiment in FIG. 11, the range of allowed increments is increased 2-fold compared to the fed-back remainder (i.e. $N_K=N_A$). The sum of a 15 bit remainder and a 16 bit K is a 17 bit word that ranges from 0-98,303. By increasing to a triple modulus divider P, (e.g., P, P+1, P+2), the two-bit overflow signal (MC1 and MC0) pulses are used to select the modulus while the same 15 bit remainder is returned for accumulation in the next period. As in the embodiments described above, a portion of this word is also used for the $(n+1)^{th}$ instance delay compensation of the multi-modulus divider output pulse. It should be obvious that this concept can be extended to higher order modulus dividers (e.g., P, P+1, P+2, P+3 etc.) in a straightforward manner by simply using more of the MSBs of the accumulator output as part of the OVF signal to control the multi-modulus divider and returning only the remaining accumulator output bits to form the remainder to be accumulated in the next period.

Figure 13:
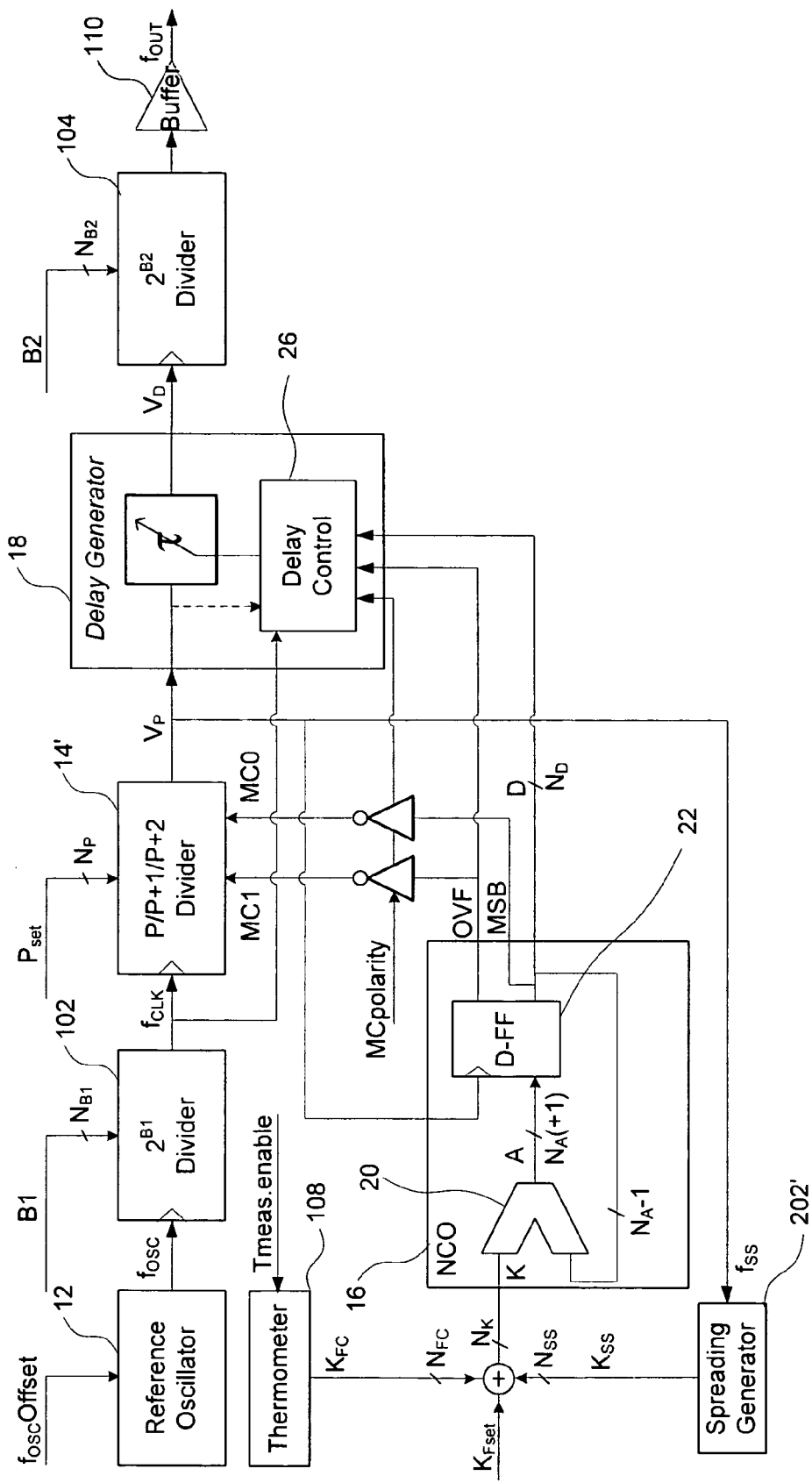
FIG. 13 illustrates the architecture of a further embodiment of the present invention.

Operationally, the formula for the output frequency of the embodiment in FIG. 13 is:

$$f_{OUT}=f_{OSC}/(P+2*K/2^{N_A}) \quad (15)$$

where $f_{OSC}$ is the reference oscillator frequency, P is the base value of the P/P+1/P+2 multi-modulus programmable divider, K is the increment and $N_A=N_K$ is the increment word length. Since K can range from 0 to $2^{N_A}-1$, $f_{OUT}$ can range from $(f_{OSC}/2^{B1+B2})/P$ to $(f_{OSC}/2^{B1+B2})/(P+2-1/2^{N_A})$. At the nominal center frequency, the ratio $2K/2^{N_A}$ would be centered around 1 and set to range from 0.5 to 1.5 in order to select any desired frequency in the range around $f_{osc}/(P+1)$. Note, the advantage of FIG. 11 over FIG. 1 is the added redundancy. There are now two values of P and K that can be used to create any specific frequency. The added degree of freedom is what makes it possible to avoid selecting a nominal value of K near either end of its allowed range. In the specific case of a triple modulus programmable divider DDS, having the normalized $2K/2^{N_A}$ range from 0.5-1.5 allows the selection of all possible frequencies with the appropriate selection of P. And, this allows any dynamic components (e.g., temperature compensation, external modulation, spread spectrum modulation, etc.) to vary the overall output period by up to +/-0.5 of a reference oscillator period before the minimum or maximum value of K is exceeded. If larger dynamic components need to be accommodated, a higher modulus programmable divider can be employed and the range of K can be further increased.

FIG. 12a illustrates the operation of the triple modulus DDS with P=4, $f_{OSC}$=2 GHz, $N_A=N_K$=4, K=11 and $N_D$=3. FIG. 12b shows the Modulus control truth table of the multi-modulus divider for values of MC0 and MC1 and FIG. 12c shows the P division cycle count and the output pulse period for all possible increments of a 4 bit word.

FIG. 13 shows an embodiment using the circuit architecture of FIG. 11 with elements of the embodiment of FIG. 9. For instance, it includes a P, P+1, P+2 multi-modulus divider 14' controlled by both the overflow OVF and the MSB as well as a spreading generator 202. The output frequency four is given by the following relationship:

$$f_{OUT}=(f_{OSC}/2^{B1+B2})*(1/P+[KF_{set}+K_{SS}(n)]/2^{N_A})) \quad (16)$$

where $f_{OUT(n)}$ is the output frequency at the nth $V_P$ instant and KSS(n) is the spreading fractional increment issued by the spreading generator (202). One skilled in the art is aware of several different approaches for the effective spreading sequence that is provided by the spread generator (202). Examples include a predetermined noise generation pattern as described above, a linear deterministic function or other deterministic function (e.g. a "Hershey Kiss" function).

Figure 14:
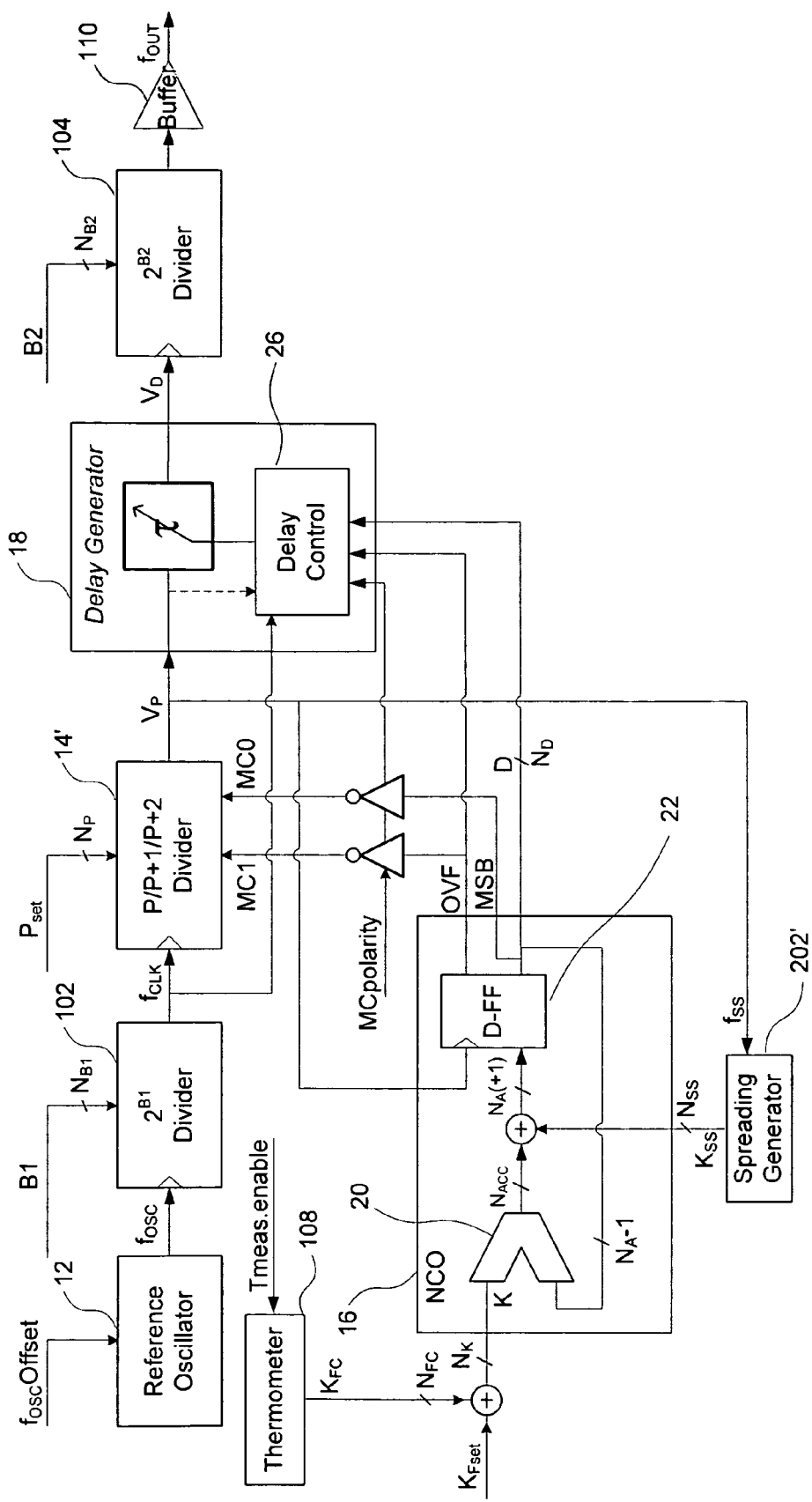
FIG. 14 illustrates a variation of the embodiment shown in FIG. 13.

FIG. 14 shows a variation of the embodiments of FIGS. 11 and 13 in which the spreading word $K_{SS}$ is added at the output of the accumulator, in a fashion similar to the embodiment of FIG. 10.

The invention claimed is:
1. A frequency synthesizer comprising:
an input for receiving a clock reference signal at a first input frequency;

a multi-modulus divider for dividing the input frequency to provide an intermediate signal with an adjusted frequency;

a numerically controlled oscillator comprising an accumulator receiving an accumulator increment value for providing a phase value and a latch circuit that receives and is clocked by the intermediate signal with the adjusted frequency wherein the numerically controlled oscillator outputs a delay value and an overflow signal each comprised of one or more bits wherein said overflow signal is provided to said multi-modulus divider to select between at least a first divider ratio and a second divider ratio; and a programmable delay generator comprising a delay control circuit that receives at least said overflow value and said delay value and calculates a delay time for application to each pulse in the intermediate signal with the adjusted frequency to provide an output signal with a final adjusted frequency ($f_{out}$).

2. The frequency synthesizer of claim 1 wherein said multi-modulus divider selects between a first divider ratio, a second divider ratio and a third divider ratio.

3. The frequency synthesizer of claim 1 wherein the accumulator increment is in the range of 0 to $2^{N_A}-1$ where $N_A$ is the number of bits in an accumulator value A output from the accumulator.

4. The frequency synthesizer of claim 3 wherein the numerically controlled oscillator latch circuit comprises at least $N_A$ switching elements to latch the accumulator value.

5. The frequency synthesizer of claim 4 wherein the value of A is latched at an average frequency of $f_{OUT}$ or at the adjusted frequency.

6. The frequency synthesizer of claim 4 wherein the latch circuit comprises at least one additional switching element for latching at least one overflow bit from the accumulator.

7. The frequency synthesizer of claim 3 wherein the delay value is at least some portion of the accumulator value.

8. The frequency synthesizer of claim 7 wherein the delay value has a number of bits $N_D$ and wherein $N_A \geq N_D$.

9. The frequency synthesizer of claim 2 wherein the multi-modulus divider selects between the first divider ratio, the second divider ratio and a third divider ratio based upon receipt of an overflow bit and the most significant bit of the delay value output from the numerically controlled oscillator.

10. The frequency synthesizer of claim 2 further comprising a programmable divider for dividing the frequency of the reference oscillator signal prior to input of that signal into the multi-modulus programmable divider.

11. The frequency synthesizer of claim 10 wherein the programmable divider is a binary divider.

12. The frequency synthesizer of claim 11, further comprising a polarity signal for inverting polarity of the overflow signal and an offset signal for varying the first input frequency.

13. The frequency synthesizer of claim 2 further comprising a programmable divider for dividing the frequency of the signal output from the delay generator to further reduce the frequency and provide the output signal with the final adjusted frequency.

14. The frequency synthesizer of claim 13 wherein at a given instant the multi-modulus divider divides the input frequency by one of three integer values, P, P+1 and P+2, wherein the programmable multi-modulus divider selects among an octave of possible values for the intermediate frequency of the intermediate signal output from the multi-modulus divider.

15. The frequency synthesizer of claim 1 further comprising a thermometer to provide an adjustment to the accumulator increment value based upon temperature.

16. The frequency synthesizer of claim 1 further comprising a pseudo-random noise generator for introducing dithering into the delay value.

17. The frequency synthesizer of claim 16 wherein the pseudo-random noise generator dithers the accumulator value by an amount of about 0.5% to about 5%.

18. The frequency synthesizer of claim 1, wherein the accumulator increment value comprises at least one of a preprogrammed constant, a temperature controlled component, a dithered component, a spread spectrum component and an external variable user-input component.

19. The frequency synthesizer of claim 18, wherein the external variable user-input component is a least one of a phase modulation component and a frequency modulation component.

20. The frequency synthesizer of claim 1 wherein the delay controller receives the intermediate signal with the adjusted frequency and the clock reference signal as inputs for synchronizing the delay time with the intermediate signal.

21. The frequency synthesizer of claim 1, wherein the clock reference signal is between 500 MHz and 10 GHz and originates from a reference oscillator utilizing a bulk acoustic wave resonator.

22. A frequency synthesizer comprising:

an input means for receiving a clock reference signal at a first input frequency;

a multi-modulus divider means for dividing the input frequency to provide an intermediate signal with an adjusted frequency;

a numerically controlled oscillator means comprising an accumulator receiving an accumulator increment value for providing a phase value and a latch circuit that receives and is clocked by the intermediate signal with the adjusted frequency wherein the numerically controlled oscillator outputs a delay value and an overflow signal comprised of one or more bits wherein said overflow signal is provided to said multi-modulus divider to select between at least a first divider ratio and a second divider ratio; and a programmable delay generator means comprising a delay control which receives at least said overflow value and said delay value and calculates a delay time for application to each pulse in the intermediate signal to provide an output signal with a final adjusted frequency ($f_{out}$).

23. The frequency synthesizer of claim 22 wherein said multi-modulus divider selects between a first divider ratio, a second divider ratio and a third divider ratio.

* * * * *